(12) United States Patent
Nazarian

(10) Patent No.: US 7,457,156 B2
(45) Date of Patent: Nov. 25, 2008

(54) NAND FLASH DEPLETION CELL STRUCTURE

(75) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 10/933,196

(22) Filed: Sep. 2, 2004

(65) Prior Publication Data
US 2006/0044872 A1 Mar. 2, 2006

(51) Int. Cl.
*G11C 11/34* (2006.01)

(52) U.S. Cl. .................... 365/185.03; 365/185.17; 365/185.18; 365/185.29; 365/185.33

(58) Field of Classification Search ........... 365/185.03, 365/185.17, 185.18, 185.29, 185.33; 438/268
See application file for complete search history.

(56) References Cited

U.S. PATENT DOCUMENTS

| | | | | |
|---|---|---|---|---|
| 5,357,462 A | * | 10/1994 | Tanaka et al. | 365/185.17 |
| 5,513,148 A | | 4/1996 | Zagar | |
| 5,581,504 A | * | 12/1996 | Chang | 365/185.17 |
| 5,909,618 A | | 6/1999 | Forbes et al. | |
| 5,936,274 A | | 8/1999 | Forbes et al. | |
| 5,936,887 A | * | 8/1999 | Choi et al. | 365/185.17 |
| 5,963,469 A | | 10/1999 | Forbes | |
| 5,973,352 A | | 10/1999 | Noble | |
| 5,973,356 A | | 10/1999 | Noble et al. | |
| 6,031,764 A | * | 2/2000 | Imamiya et al. | 365/185.17 |
| 6,058,045 A | * | 5/2000 | Pourkeramati | 365/185.17 |
| 6,107,658 A | * | 8/2000 | Itoh et al. | 365/185.17 |
| 6,108,238 A | * | 8/2000 | Nakamura et al. | 365/185.17 |
| 6,150,687 A | | 11/2000 | Noble et al. | |
| 6,191,448 B1 | | 2/2001 | Forbes et al. | |
| 6,330,189 B1 | * | 12/2001 | Sakui et al. | 365/185.17 |
| 6,465,298 B2 | | 10/2002 | Forbes et al. | |
| 6,977,842 B2 | * | 12/2005 | Nazarian | 365/185.29 |
| 7,005,350 B2 | * | 2/2006 | Walker et al. | 438/268 |

* cited by examiner

*Primary Examiner*—Trong Phan
(74) *Attorney, Agent, or Firm*—Leffert Jay & Polglaze, P.A.

(57) ABSTRACT

NAND architecture Flash memory strings, memory arrays, and memory devices are described that utilize depletion mode floating gate memory cells. Depletion mode floating gate memory cells allow for increased cell current through lower channel $r_{ds}$ resistance and decreased "narrow width" effect, allowing for increased scaling of NAND memory cell strings. In addition, the required voltages for reading and programming operations are reduced, allowing the use of more efficient, lower voltage charge pumps and a reduction circuit element feature sizes and layouts. Cell inhibit of unselected cells is also increased, reducing the likelihood of cell disturb in the memory array. Operation speed is improved by increasing read current of the selected NAND string and by increasing the ability to overcome the RC time constants of circuit lines and capacitances through lowered voltage swings and increased current supplies.

57 Claims, 7 Drawing Sheets

NAND FLASH DEPLETION CELL STRUCTURE

TECHNICAL FIELD OF THE INVENTION

The present invention relates generally to non-volatile memories and in particular the present invention relates to NAND architecture depletion memory cells.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates.

Yet another type of non-volatile memory is a Flash memory. A typical Flash memory comprises a memory array, which includes a large number of memory cells. Each of the memory cells includes a floating gate embedded in a field effect transistor (FET). The cells are usually grouped into sections called "erase blocks." Each of the cells within an erase block can be electrically programmed selectively by tunneling charges to the floating gate. The negative charge is typically removed from the floating gate by a block erase operation, wherein all floating gate memory cells in the erase block are erased in a single operation.

Two common types of Flash memory array architectures are the "NAND" and "NOR" architectures, so called for the resemblance which the basic memory cell configuration of each architecture has to a basic NAND or NOR gate circuit, respectively. In the NOR array architecture, the floating gate memory cells of the memory array are arranged in a matrix. The gates of each floating gate memory cell of the array matrix are connected by rows to word select lines (word lines) and their drains are connected to column bit lines. The source of each floating gate memory cell is typically connected to a common source line. The NOR architecture floating gate memory array is accessed by a row decoder activating a row of floating gate memory cells by selecting the word line connected to their gates. The row of selected memory cells then place their stored data values on the column bit lines by flowing a differing current if in a programmed state or not programmed state from the connected source line to the connected column bit lines.

A NAND array architecture also arranges its array of floating gate memory cells in a matrix such that the gates of each floating gate memory cell of the array are connected by rows to word lines. However each memory cell is not directly connected to a source line and a column bit line. Instead, the memory cells of the array are arranged together in strings, typically of 8, 16, or more each, where the memory cells in the string are connected together in series, source to drain, between a common source line and a column bit line. The NAND architecture floating gate memory array is then accessed by a row decoder activating a row of floating gate memory cells by selecting the word select line connected to their gates. In addition, the word lines connected to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the column bit line to the source line through each floating gate memory cell of the series connected string, restricted only by the memory cells of each string that are selected to be read. The stored data values of the row of selected memory cells are thereby placed on the column bit lines to be sensed.

A problem with programming Flash memories is that programming and/or erasure typically involves applying a high voltage to elements of the memory array. As memory device features are scaled smaller in modern integrated circuit processes the use of high programming and erasure voltages becomes a more of an issue due to increased electric fields and coupling across smaller features and thinner oxides. This can require the usage of larger feature circuit elements or differing circuit designs in these portions of the memory array in order for them to be able to withstand the higher programming voltages.

Additionally, the high programming voltages applied to the individual floating gate memory cells can lead to problems with write fatigue of the selected memory cells and an increased likelihood of disturb problems in the unselected memory cells of the array. The reduced feature sizes also may lead to increased resistances in the memory device elements and, in particular, in the floating gate memory cells, reducing the overall performance of the memory device, reducing the practical limits of memory string length in cells, reducing memory string current, and increasing the applied voltage levels as they are raised to compensate.

For the reasons stated above, and for other reasons stated below which will become apparent to those skilled in the art upon reading and understanding the present specification, there is a need in the art for improved Flash memory arrays.

SUMMARY

The above-mentioned problems with Flash memories and other problems are addressed by the present invention and will be understood by reading and studying the following specification.

The various embodiments relate to NAND architecture Flash memory strings, memory arrays, and memory devices that utilize depletion mode floating gate memory cells and/or select gates. The use of depletion mode floating gate memory cells in the NAND strings and NAND memory arrays allows for increased cell current by lowering the $r_{ds}$ resistance of the cells of the string and increasing the cell channel coupling to the floating gate and word line by the applied voltage. The use of depletion mode floating gate memory cells also decreases "narrow width" effect on cell channel resistance. Both of these effects allow for increased scaling of NAND memory cell arrays through further reductions in process feature sizes and scaling of NAND strings to lengths greater than 16 cells. An additional benefit of use of depletion mode cells in NAND memory arrays is a reduction of the required voltages for reading and programming operations on the NAND memory strings. This allows the use of lower voltage charge pumps that are more power efficient and are able to more readily supply current to the memory array. In addition, the reduced read and programming voltages allow for reduction of the required voltage limits of circuit elements and therefore their required feature sizes and layouts. In one embodiment, 1.8V, approximately Vcc, is directly utilized to place unselected cells of a selected NAND string in pass-through mode to allow reading of a selected cell of the string. In another embodiment of the present invention, cell inhibit of unselected cells is increased with the utilization of depletion mode floating gate memory cells during programming, therefore reducing the likelihood of cell disturb in the memory array. Embodiments of the present invention also increase memory array operation speed by increasing read current of the selected NAND string, allowing it to sink current from a connected bitline at an increased rate. In addition, speed is increased by the reduction of the required voltage limits of circuit elements and therefore their required feature sizes and layouts. Reduced read/programming voltage levels also increase speed of operation by increasing the ability of memory embodiments of the present invention to overcome the RC time constants of circuit lines and capacitances through lowered voltage swings and increased current supply. In one embodiment of the present invention, a reduction in the likelihood of voltage breakdown of the select gates of the NAND string are accomplished through use of a depletion mode select transistor. In other embodiments of the present invention, a NAND string of depletion mode floating gate transistor is programmed utilizing boosted bitline, boosted source line, boosted tub, or non-precharge programming, allowing generation of a channel that is adjustable and of a more uniform nature.

For one embodiment, the invention provides a depletion mode NAND architecture floating gate memory cell string comprising a NAND architecture floating gate memory cell memory string formed on a substrate having a plurality of depletion mode floating gate memory cells coupled source to drain in a serial string.

In another embodiment, the invention provides a depletion mode NAND architecture Flash memory array comprising a NAND architecture memory array formed on a substrate having a plurality of depletion mode floating gate memory cells arranged in rows and columns in a plurality of erase blocks, wherein the plurality of depletion mode floating gate memory cells are serially coupled source to drain into a plurality of NAND memory cell strings, a plurality of word lines, wherein each word line is coupled to one or more gates of a row of the depletion mode floating gate memory cells, a plurality of bitlines, wherein each bitline is coupled to a first floating gate memory cell of one or more strings through a drain control gate transistor, and at least one source line, wherein the at least one source line is coupled to a last floating gate memory cell of one or more strings through a source control gate transistor.

In yet another embodiment, the invention provides a system comprising a host coupled to a Flash memory device. The Flash memory device comprises a depletion mode NAND architecture memory array formed on a substrate having a plurality of depletion mode floating gate memory cells arranged in rows and columns and coupled into a plurality of NAND memory cell strings, a plurality of word lines, wherein each word line is coupled to one or more gates of a row of the floating gate memory cells, a plurality of bitlines, wherein each bitline is coupled to a drain of a first floating gate memory cell of one or more strings, and at least one source line, wherein the at least one source line is coupled to a source of a last floating gate memory cell of one or more strings.

In a further embodiment, the invention provides a method of programming a NAND architecture floating gate memory cell array comprising applying a precharge voltage to a substrate of the NAND architecture memory array, wherein the NAND architecture memory array contains a plurality of depletion mode floating gate memory cells serially coupled source to drain in a plurality of strings, applying a word line programming voltage to a selected floating gate memory cell of each string of a selected number of strings, applying a pass voltage to one or more non-selected floating gate memory cells of each string of the selected number of strings, and selectively applying a program voltage to a channel of each string of the selected number of strings.

In yet a further embodiment, the invention provides a method of programming a NAND architecture floating gate memory cell array comprising applying a precharge voltage to a source line, coupling the precharge voltage from the source line to a selected number of depletion mode NAND memory cell strings of a NAND architecture memory array, wherein each memory cell string of the array contains a plurality of depletion mode floating gate memory cells serially coupled source to drain, applying a word line programming voltage to a selected floating gate memory cell of each string of a selected number of strings, applying a pass voltage to one or more non-selected floating gate memory cells of each string of the selected number of strings, uncoupling the precharge voltage from the selected number of strings, and selectively applying a program voltage to a channel of each string of the selected number of strings.

In another embodiment, the invention provides a method of programming a NAND architecture floating gate memory cell array comprising selectively applying a program voltage to a plurality of bitlines, coupling the program voltage from the plurality of bitlines to a channel of a selected number of depletion mode NAND memory cell strings of a NAND architecture memory array to precharge the channel, wherein each memory cell string of the array contains a plurality of depletion mode floating gate memory cells serially coupled source to drain, applying a word line programming voltage to a selected floating gate memory cell of each string of a selected number of strings, and applying a pass voltage to one or more non-selected floating gate memory cells of each string of the selected number of strings.

In yet another embodiment, the invention provides a method of programming a NAND architecture floating gate memory cell array comprising selectively applying a program voltage to a channel of a selected number of depletion mode NAND memory cell strings of a NAND architecture memory array, wherein each memory cell string of the array contains a plurality of depletion mode floating gate memory cells serially coupled source to drain, and where the channel is a pre-existing depletion channel, applying a word line programming voltage to a selected floating gate memory cell of each string of a selected number of strings, and applying a pass voltage to one or more non-selected floating gate memory cells of each string of the selected number of strings.

In a further embodiment, the invention provides a NAND architecture floating gate memory cell string comprising a single continuous channel region formed on a substrate, and a plurality of floating gate memory cells formed on the single continuous channel region.

In yet a further embodiment, the invention provides a method of making a NAND architecture memory array comprising forming a plurality of floating gate memory cells on a substrate, wherein the plurality of floating gate memory cells are arranged in rows and columns into a plurality of erase blocks, and were the memory cells are coupled into a plurality of NAND memory cell strings, each NAND memory string having a continuous doped channel region which underlies each cell of the string.

Further embodiments of the invention include methods and apparatus of varying scope.

DETAILED DESCRIPTION

Figure 1:
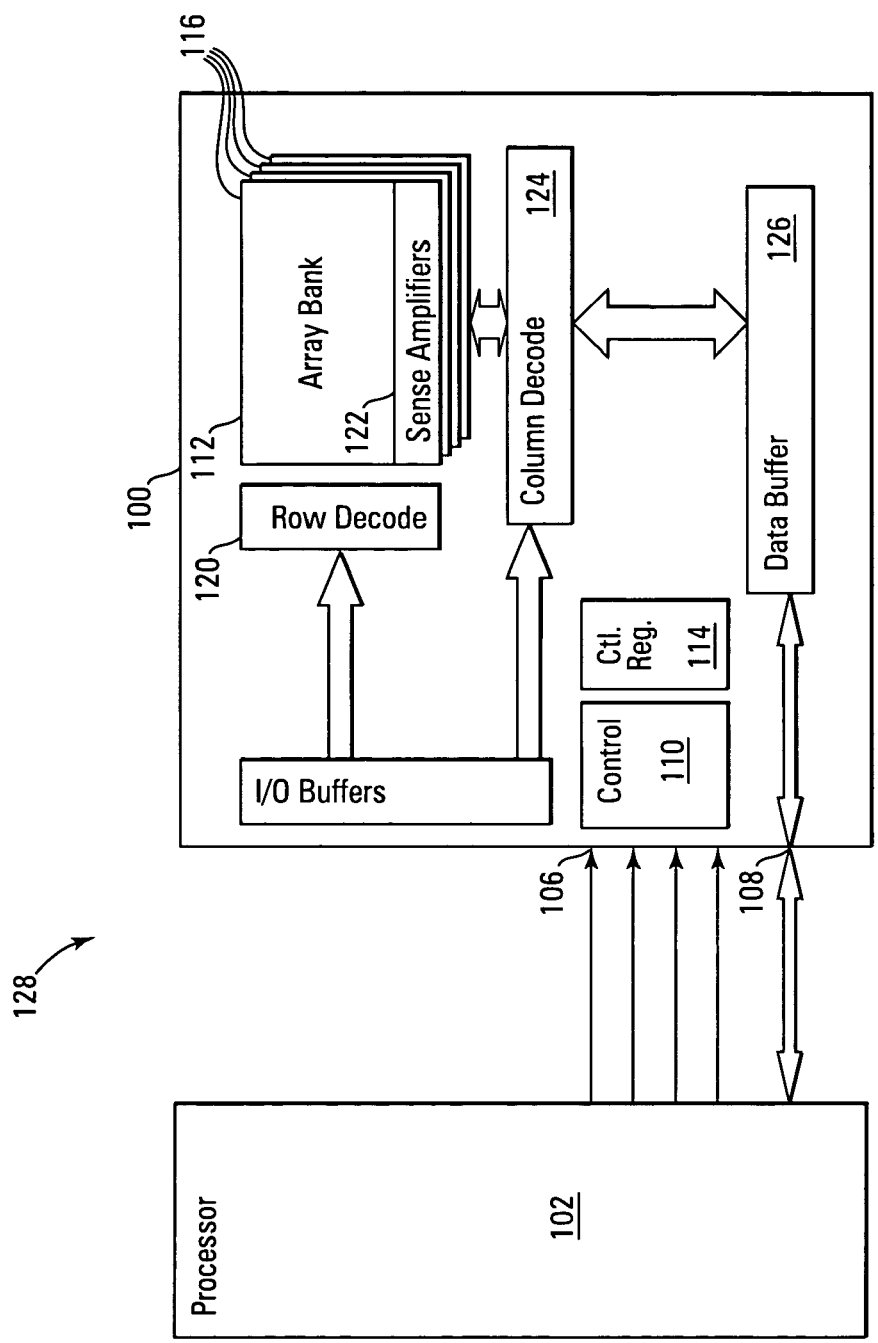
FIG. 1 is a simplified block diagram of a system containing a depletion mode NAND architecture Flash memory device in accordance with an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

The various embodiments relate to NAND architecture Flash memory strings, memory arrays, and memory devices that utilize depletion mode floating gate memory cells and/or select gates. The use of depletion mode floating gate memory cells in the NAND strings and NAND memory arrays allows for increased cell current by lowering the $r_{ds}$ resistance of the cells of the string and increasing the effect on the cell channel by the applied voltage. The use of depletion mode floating gate memory cells also decreases "narrow width" effect on cell channel resistance. Both of these effects allow for increased scaling of NAND memory cell arrays through further reductions in process feature sizes and scaling of NAND strings to lengths greater than 32 cells. An additional benefit of use of depletion mode cells in NAND memory arrays is a reduction of the required voltages for reading and programming operations on the NAND memory strings. This allows the use of lower voltage charge pumps that are more power efficient and are able to more readily supply current to the memory array. In addition, the reduced read and programming voltages allow for reduction of the required voltage limits of circuit elements and therefore their required feature sizes and layouts. In one embodiment, Vcc is directly utilized to place unselected cells of a selected NAND string in pass-through mode to allow reading of a selected cell of the string. In another embodiment of the present invention, cell inhibit characteristics of unselected cells is increased with the utilization of depletion mode floating gate memory cells during programming, therefore reducing the likelihood of cell disturb in the memory array, in particular in multi-level cells and memory devices which store multiple bits in a cell with differing threshold voltage levels. Embodiments of the present invention also increase memory array operation speed by increasing read current of the selected NAND string, allowing it to sink current from a coupled bitline at an increased rate. In addition, speed is increased by the reduction of the required voltage limits of circuit elements and therefore their required feature sizes and layouts. Reduced read/programming voltage levels also increase speed of operation by increasing the ability of memory embodiments of the present invention to overcome the RC time constants of circuit lines and capacitances through lowered voltage swings and increased current supply. In one embodiment of the present invention, a reduction in the likelihood of voltage breakdown of the select gates of the NAND string are accomplished through use of a depletion mode select transistor. In other embodiments of the present invention, a NAND string of depletion mode floating gate transistor is programmed utilizing boosted bitline, boosted source line, boosted tub, or non-precharge programming, allowing generation of a channel that is adjustable and of a more uniform nature.

FIG. 1 shows a simplified diagram of a system 128 incorporating a depletion mode NAND architecture Flash memory 100 embodiment of the present invention connected to a host 102, which is typically a processing device or memory controller. The Flash memory 100 has a control interface 106 and an address/data interface 108 coupled through I/O Buffers that are each connected to the processing device 102 to allow memory read and write accesses. It is noted that in alternative embodiments, the address/data interface 108 can be divided into separate interfaces. Internal to the Flash memory device a control state machine 110 directs the internal operation; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116, each bank 116 is organized logically into a series of erase blocks (not shown). One or more charge pumps (not shown) generate elevated positive and/or negative voltages, where not externally available, for use internal to the Flash memory in read and write accesses.

Memory access addresses are received on the address/data interface 108 of the Flash memory 100 and divided into a row and column address portions. On a read access the row address is latched and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

As stated above, a NAND array architecture arranges its array of floating gate memory cells in a matrix such that the gates of each floating gate memory cell of the array are connected by rows to word select lines. The memory cells of the array are arranged together in strings, typically of 8, 16 or more each, where the memory cells connected together in series, source to drain, between a source line and a column bit line. The NAND architecture floating gate memory array is then accessed by a row decoder activating a row of floating gate memory cells by selecting the word select line connected to their gates. In addition, the word lines connected to the gates the unselected memory cells of each string are driven to operate the unselected memory cells of each string as pass transistors, so that they pass current in a manner that is unrestricted by their stored data values. In a read operation, current then flows from the source line to the column bit line through each series connected string, restricted only by the memory cells selected to be read in each string. Thereby placing the current encoded stored data values of the row of selected memory cells on the column bit lines.

The floating gate memory cells of NAND architecture memory strings are typically formed from field effect transistors (FETs), such as a metal oxide semiconductor field effect transistor (MOSFET or MOS transistor), that are fabricated on an integrated circuit substrate. The floating gate memory cell includes a source region and a drain region that is spaced apart from the source region to form an intermediate channel region. A floating gate, typically made of doped polysilicon, is disposed over the channel region and is electrically isolated from the other cell elements by a dielectric material, typically an oxide. For example, tunnel insulator or oxide can be formed between the floating gate and the channel region. A control gate is located over the floating gate and is also typically made of doped polysilicon. The control gate is electrically separated from the floating gate by another dielectric layer, typically called the intergate insulator. Thus, the floating gate is electrically "floating" so that it is insulated from both the channel and the control gate. Charge is transported to or removed from the floating gates by specialized programming and erase operations, respectively. The insertion of charge on the floating gate alters the native threshold voltage of the floating gate transistor by imposing the trapped charge stored on the floating gate between the control gate and the channel of the device, increasing or lowering the effective threshold voltage level of the floating gate memory cell.

The fabrication of the structures of the various example embodiments are demonstrated using silicon MOS technology. Memory cells of the example embodiments are fabricated on a polysilicon layer having a conductivity type, such as an n-type conductivity, overlying a monocrystalline silicon substrate. However, as noted above, other substrates and/or circuit element materials may be used for integrated circuit fabrication. Furthermore, the various embodiments could similarly be fabricated having opposite conductivity, using appropriate changes in dopants, channel depletion regions, and applied voltages. Additionally, various components of the memory cells may be fabricated in an order different from the example embodiments while still producing a memory cell in accordance with the invention.

Floating gate memory cells of NAND architecture memory arrays and strings of the prior art utilize "enhancement" mode FET transistor devices. Enhancement mode FET transistors require a gate to drain voltage applied to the device that is equal to or greater than the threshold voltage (Vth) of the device to form a channel of carriers connecting the source and drain, turning the FET transistor "on" and allowing it to conduct electricity. In floating gate transistors, this native threshold voltage is also known as the UV erased threshold (UV-Vth).

"Depletion" mode FET transistors differ from enhancement mode FET transistors in that carriers naturally exist in the channel, connecting the source and drain of the device. Depletion mode FETs typically have a negative UV-Vth and require a negative gate to drain voltage to be applied to the device to drive carriers from the channel and turn the device "off." One manner in which depletion mode transistors may be formed is from the implantation of a doping material into the channel creating a N-region or resistor area connecting the source and drain regions as the device is formed. Because of this formed channel, depletion mode transistors have been commonly used by circuit designers to form resistances in integrated circuits more area efficiently than the use of simple diffusions. As a result of their always-on characteristic, depletion mode floating gate transistors require the use of select transistors to isolate them from the bitlines or a negative voltage applied to their gates to prevent them from conducting and corrupting other read or write operations occurring on their coupled bitlines.

Figure 2A:
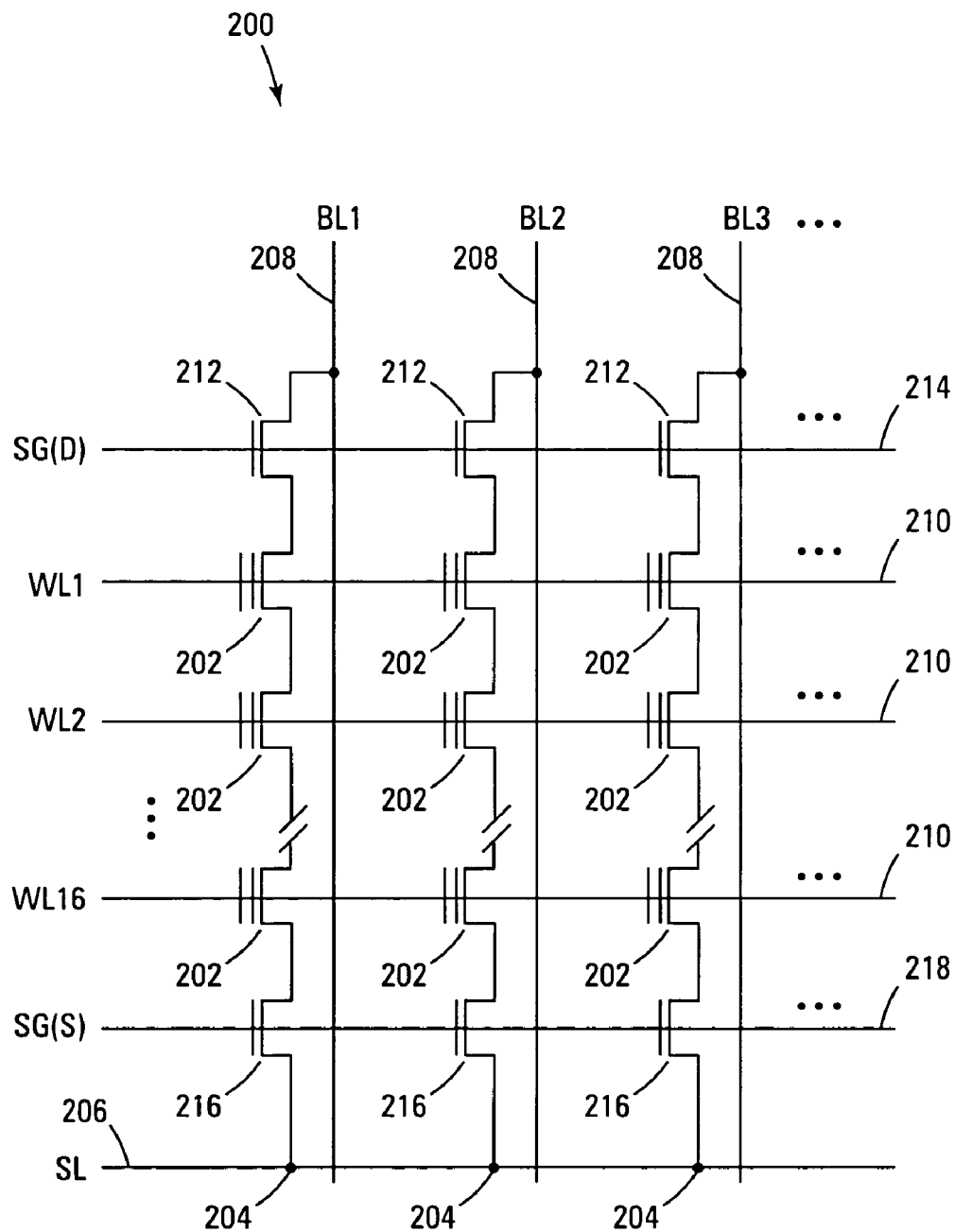
FIGS. 2A, 2B, 2C, and 2D are simplified block diagrams of series string(s) of depletion mode floating gate memory cells of a NAND architecture Flash memory array in accordance with an embodiment of the present invention.

FIG. 2A shows a simplified diagram of a NAND Flash architecture floating gate memory array 200 of an embodiment of the present invention. In FIG. 2A, a NAND Flash array is comprised of a sequence of floating gate cell series strings 204. Each floating gate cell series string 204 contains 16 depletion mode N-FET floating gate memory cells 202 that are connected drain to source in a series chain. Word lines (WL1-WL16) 210 that span across multiple series strings 204 are connected to the control gates of every floating gate cell 202 to control their operation. In operation, word lines 210 select the individual floating gate memory cell 202 in the series chain 204 to be written to or read from and operate the remaining floating gate memory cells 202 in each series string 204 in a pass through mode. Each series string 204 of floating gate memory cells 202 are connected to a source line 206 by a source select gate 216 and to an individual bitline (BL1-BLN) 208 by a drain select gate 212. The source select gates 216 are controlled by a source select gate control line (SG(S)) 218 connected to their control gates. The drain select gates 212 are controlled by a drain select gate control line (SG(D))

214. For one embodiment of the present invention, drain select gates 212 and/or the source select gates 216 are enhancement mode FET transistors. In an alternative embodiment of the present invention, the drain select gates 212 and/or the source select gates 216 are depletion mode FET transistors. The use of depletion mode transistors in the select gates 212, 216 require the use of negative voltage on the gate to force the select gate to turn "off", but they form a gradual junction at the source and/or drain and allow for higher voltage differentials across the select gates 212, 216 and thus higher voltages to be applied or capacitively coupled to the NAND strings 204 without the danger of gate field induced drain leakage to substrate or breakdown to substrate of the select gates 212, 216.

Figure 2B:
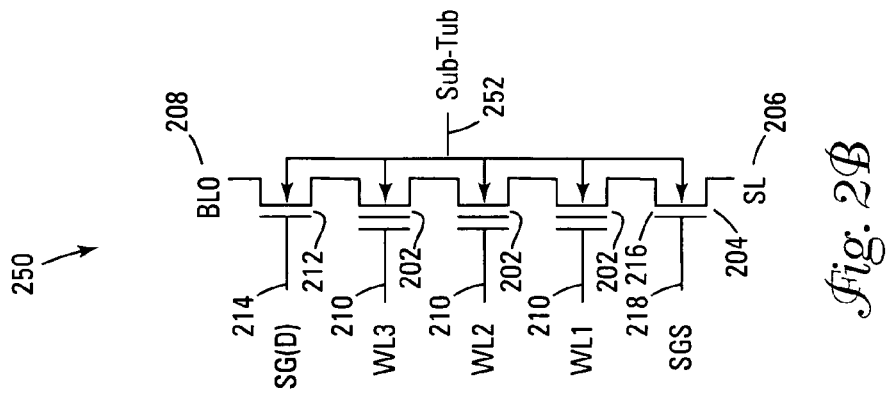

FIG. 2B shows a simplified schematic diagram of a depletion mode NAND Flash architecture array 250 of an embodiment of the present invention, showing a floating gate memory string 204 and the coupling of its depletion mode floating gate memory cells 202 to the substrate/substrate tub 252. In FIG. 2B, a NAND floating gate cell series string 204 contains depletion mode N-FET floating gate memory cells 202 that are connected drain to source in a series chain. Word lines (WL1-WL3) 210 are connected to the control gates of the depletion mode floating gate memory cells 202 to control their operation. In operation, the word lines 210 select the individual depletion mode floating gate memory cell 202 in the series chain 204 to be written to or read from and operate the remaining depletion mode floating gate memory cells 202 in the series string 204 in a pass through mode. The series string 204 is connected to a source line 206 by a source select gate 216 and to a bitline (BL0) 208 by a drain select gate 212. The source select gate 216 is controlled by a source select gate control line (SG(S)) 218 connected to the control gate. The drain select gate 212 is controlled by a drain select gate control line (SG(D)) 214. The control gate, floating gate, source, and drain are capacitively connected to the substrate tub 252. In addition, the source and drain are electrically and capacitively coupled by the intrinsic PN junction diode formed between the source, drain, and channel junctions and the substrate/substrate tub 252. Typically, a NAND Flash memory array is formed in bank or erase block segments. In many cases the banks or segments are formed on one or more electrically isolated substrate tubs. For example, N-FET floating gate cell banks or segments can be separated by substrate tubs formed with P doped tubs isolated by a deep N wells in a P substrate. The substrate tubs allow for electrical isolation of the individual banks or erase blocks and enable individual bank or erase block segment operations, such as bulk erasure of the bank or erase block via the substrate tub and word lines.

Figure 2C:
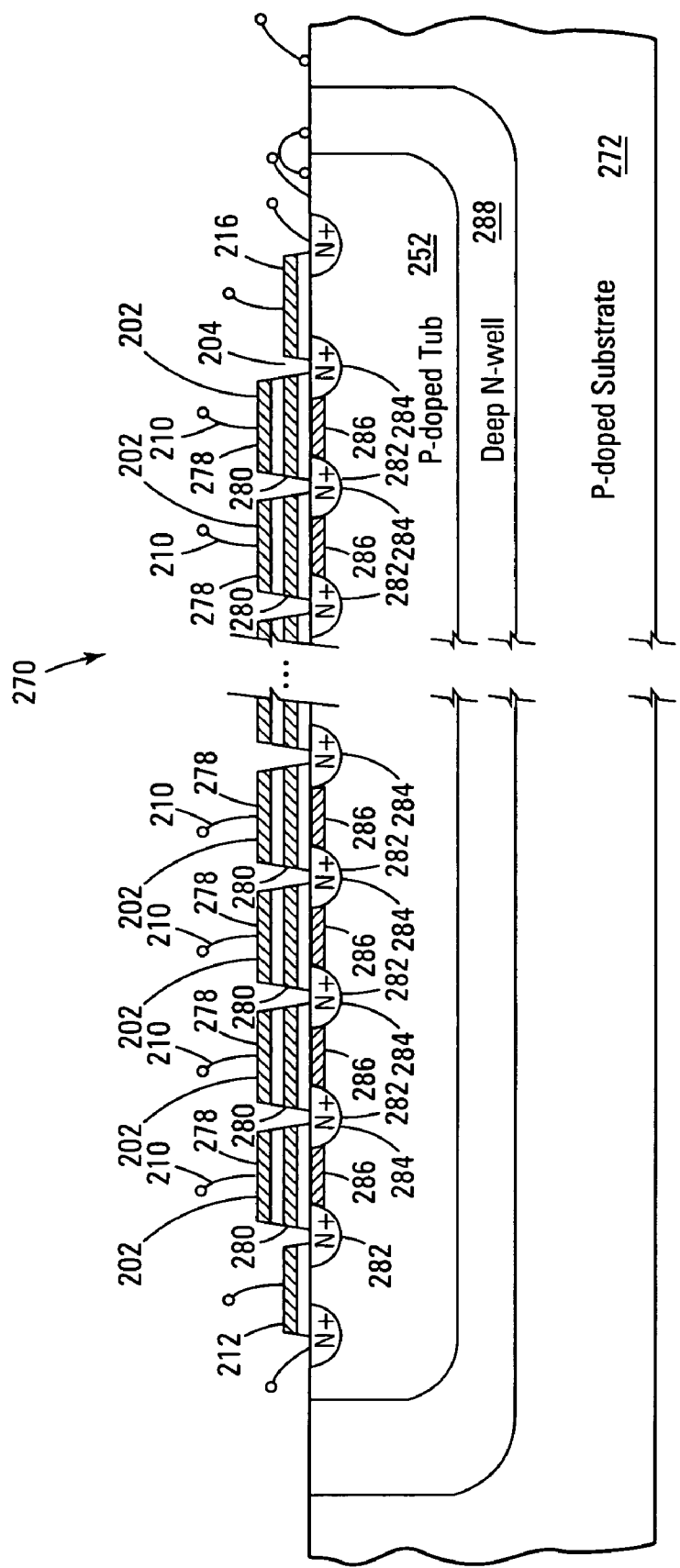

FIG. 2C shows a simplified diagram of a NAND Flash architecture array 270 of an embodiment of the present invention, showing a cross section of a series connected string 204 of physical depletion mode floating gate transistor memory cells 202 and their relationship to a substrate 272, well 288, and/or substrate tub 252. In FIG. 2C, depletion mode N-FET floating gate transistor memory cells 202 are formed on a P doped substrate tub 252, which is in turn encased in a N-doped well 288 formed in a P-doped substrate 272. The N-FET floating gate transistor memory cells 202 each have a source well 284, a drain well 282, and a depletion channel 286 where minority carriers (electrons) are present to couple the source 284 and drain 282 regions of each N-FET floating gate transistor 202. Each N-FET floating gate transistor memory cell 202 has a floating gate 280 and a control gate 278 formed over the source 284, drain 282, and channel area 286, which are isolated from each other by insulator layers (typically silicon oxide).

Figure 2D:
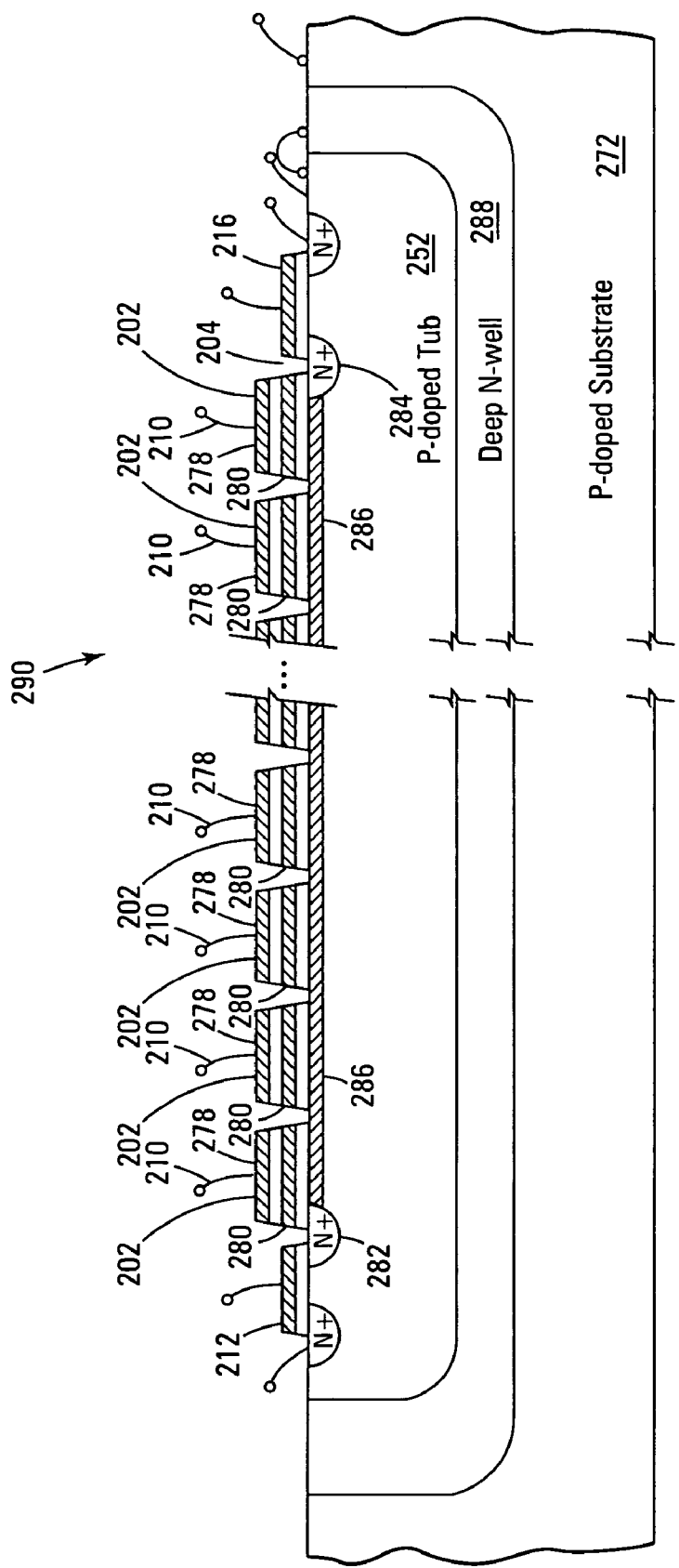

An alternative embodiment, shown in FIG. 2D, the source wells 284 and drain wells 282 of each depletion mode floating gate transistor memory cell 202 are omitted to form a single continuous channel depletion area 286 connecting the drain select gate 212 and source select gate 216, the continuous channel depletion area 286 running under the floating gates 280 and control gates 278 of the depletion mode floating gate transistor memory cells 202 without intervening source wells 284 or drain wells 282. In one embodiment, the continuous channel depletion area 286 may be a resistive diffusion region. FIG. 2D shows a simplified diagram of a NAND Flash architecture array 290 of an embodiment of the present invention with a continuous channel depletion area 286, showing a cross section of a series connected string 204 of physical depletion mode floating gate transistor memory cells 202 and their relationship to a substrate 272, well 288, and/or substrate tub 252. In FIG. 2C, depletion mode N-FET floating gate transistor memory cells 202 are formed on a P-doped substrate 272 or, alternatively formed on a P doped substrate tub 252, which is in turn encased in a N-doped well 288 formed in a P-doped substrate 272. The N-FET floating gate transistor memory cells 202 each have a single depletion channel 286 running under the memory cells 202, where minority carriers (electrons) are present to couple each N-FET floating gate transistor 202 to its adjacent cells 202. Each N-FET floating gate transistor memory cell 202 has a floating gate 280 and a control gate 278 formed over the channel area 286, which are isolated from each other by insulator layers (typically silicon oxide).

It is noted that other forms of depletion mode Flash NAND architecture memory arrays and memory strings, having differing configurations and differing numbers and types of memory cells, such as depletion mode P-FET floating gate memory cells, and/or differing arrangements of substrate tubs 252, isolation wells 288, and/or substrate 272 are possible for embodiments of the present invention and should be apparent to those skilled in the art with the benefit of the present disclosure.

As stated above, the various embodiments relate to NAND architecture Flash memory strings, memory arrays, and memory devices that utilize depletion mode floating gate memory cells and/or depletion mode select gates. Depletion mode floating gate FET's require special handling because of their conductivity when inactive (also known as an "always-on" or normally closed condition). This characteristic of being conductive when in the UV-Vth erased state and/or not being driven by a negative gate voltage requires the use of negative control gate voltages when the depletion mode floating gate FET memory cell is not being accessed or placement of the depletion mode floating gate FET memory cell behind select gates to prevent the inactive conduction state from corrupting memory operations occurring to other NAND strings on commonly coupled bitlines or source lines.

The use of depletion mode floating gate memory cells in the NAND strings and NAND memory arrays of embodiments of the present invention allows for increased cell current in the NAND memory strings. In depletion mode floating gate memory cell FETs, the $r_{ds}$ resistance of the channel of the cell is lower compared to that of a comparable enhancement mode floating gate memory cell FET. This lowered $r_{ds}$ of the depletion mode cell is due to the carriers already present in the channel due to the formed depletion region connecting the cell's source and drain. The carriers of depletion region add to the carriers generated by any applied source-gate voltage and increasing the current flowing in the cell for a given control gate voltage. In an alternative perspective, the depletion region of the depletion mode FET can be viewed as equivalent to a resistor that is coupled in parallel to the channel of carriers formed by the applied control gate voltage and its equivalent resistance. As a result of these lower $r_{ds}$ resistance of depletion mode memory cells, the NAND strings of embodiments of the present invention have increased current flow and an increased current response to the applied control gate voltages.

In addition to the lowering of the channel $r_{ds}$, depletion mode floating gate memory cells have been shown to have a lower "narrow width" resistance effect on cell channel resistance. In narrow width effect, the resistance of the FET's channel increases as the channel length is reduced due to reducing the feature size of circuit elements in the integrated circuit. As the FET channel length is reduced more control gate voltage must be applied to form the channel and carriers. As the depletion channel of the depletion mode floating gate FET memory cell of embodiments of the present invention are already formed and carriers already present, the higher control gate voltage required by the narrow width effect is reduced.

The increased current flow, due to the reduced $r_{ds}$ and reduced narrow width effect, allow for increased scaling of NAND memory cell strings and arrays in embodiments of the present invention and further reductions in circuit element feature sizes through process improvement. In addition, the scaling of NAND strings to memory cell lengths of, or greater than, 32 or 64 cells in embodiments of the present invention are enabled due to the increased string current flow and reduced channel resistances.

As also state above, an additional benefit of use of depletion mode cells in NAND memory arrays of embodiments of the present invention is a reduction of the required operating voltages for the NAND memory strings, allowing read operations and programming operations to benefit. These voltage reductions are due to the reduced threshold voltages of the depletion mode floating gate FET memory cell and the lowered channel resistance of the resulting NAND memory strings that allow for higher channel currents.

In a programming operation, carriers are formed or "precharged" in the channels of the floating gate memory cells of the selected NAND string. The unselected cells of the memory string are placed in pass-through mode by the application of a control gate voltage that places the unselected cells in an "on" state regardless of their state of programming (the applied pass through control gate voltage will place them in an on state regardless if they have a programmed or unprogrammed threshold voltage (Vth)). A high level programming voltage, such as 20V, is applied on the word line of the memory cell of the NAND string that has been selected for programming and the programmed state of the selected memory cell is then determined by the application of a program voltage (typically a low voltage, such as 0V, that triggers electron tunneling or injection into the floating gate because of the channel to control gate voltage differential) or program-inhibit voltage (typically a higher voltage, such as 4.5V, that will not trigger electron tunneling) on the coupled bitline, allowing the threshold voltage of the selected cell to be altered and a data value to be stored.

In the prior art, the tunneling of electrons to the floating gate of an enhancement memory cell during a programming operation is due to voltage differential formed between the channel and floating gate. The necessary channel, however, is formed in the enhancement FET-type floating gate memory cell upon the FET being activated by the control gate voltages and overcoming the threshold voltage (Vth) of the cell. Because of this, many NAND memory string programming methods utilize a precharge cycle to precharge carriers into the channel before applying the programming voltage to the control gate.

As the base UV erased threshold voltage level (UV-Vth) of the depletion mode floating gate FET memory cell is a negative voltage (such as −1V) and a depletion region channel of carriers is already formed, the depletion mode floating gate FET memory cell can be programmed with a smaller precharge operation/base voltage or programmed directly with no precharge at all. Thus the overall control gate-channel/control gate-source programming voltage required to program depletion mode floating gate FET memory cells of embodiments of the present invention is reduced, such as from a 20V control gate programming voltage to a 17V control gate programming voltage and a −1V or 0V channel programming voltage and a 1.8V channel inhibit voltage. This lower control gate-channel programming voltage allows the use of lower voltage circuit design and circuit elements in memory arrays of embodiments of the present invention. The lower programming voltage also allows a more effective inhibit of unselected cells of other NAND memory strings that are coupled to the same word line as a selected memory cell of a NAND memory string selected for programming to have lower voltage differential and therefore be less likely to suffer disturb of their stored data.

The voltages applied to NAND memory strings and arrays of embodiments of the present invention during read operations are also lowered due to the use of depletion mode floating gate FET memory cells. In a read operation the unselected cells of a selected NAND memory string are placed in pass-through mode by the application of a control gate read pass voltage that places the unselected cells in an "on" state regardless of their state of programming (the applied pass-through control gate voltage that will place them in an on state regardless of their programmed or unprogrammed threshold voltage (Vth)). A lower read voltage (a voltage that allows their programmed or unprogrammed threshold voltage to affect the amount of current flow through the selected memory cell) is applied on the word line of the memory cell of the NAND string that has been selected for reading. The programmed state of the selected memory cell activated by the read voltage applied to the control gate then determines the amount of current the NAND memory string passes from the connected bitline, allowing the data value of the selected cell to be read. In NAND memory strings and arrays of embodiments of the present invention both the pass-through and read control gate voltages are lowered due to the lowered threshold voltages of the depletion mode floating gate memory cells of the string(s) and lower $r_{ds}$ of the depletion mode memory cell channels. The reduction of the pass through voltage on the un-selected cells also improves the reliability of the cells against read disturb.

In one embodiment of the present invention, a Vcc level voltage is used as a read pass-through voltage. This use of the externally provided Vcc in read operations and/or other internal operations allows for decreased dependence on internally generated voltages and the voltage charge pumps that provide these internally generated voltages. The externally provided Vcc typically has a greater current sourcing ability than the internal voltage charge pumps, which allows for an increased current availability to internal circuitry and subsequent increase in operational speed of the unselected word lines and memory. The use of the typically always-on Vcc also avoids the start-up delay period due to the charge pumps having to start up and bring the internally generated voltages up to specification on the internal power busses after coming out of stand-by or deep power-down, further increasing access speed and general memory read availability. The use of Vcc as the pass voltage for the unselected word lines during read also avoids the additional power consumption of the replaced low power efficiency charge pumps within the memory.

The erase voltages applied to NAND memory strings and arrays of embodiments of the present invention are also lowered due to the use of depletion mode floating gate FET memory cells. A typical erase cycle begins by programming all the memory cells of an erase block that has been selected for erasure. Once the cells of the erase block have been programmed, they are erased by a series of voltage erase pulses that are applied to remove charge from the floating gates of the memory cells and place their threshold voltages at the unprogrammed state. The memory cells of the erased memory block are then verified to ensure proper erasure. The use of depletion mode floating gate FET memory cells in NAND memory strings and arrays of embodiments of the present invention lower both the voltages used in the programming and erase pulse cycles of the block erasure, due to the lowered threshold levels of the depletion mode floating gate FET memory cells. The lowered erasure voltages also provide a more narrow distribution of threshold voltages in the memory cells of erased memory blocks, because of the smaller overall voltages used, allowing for faster, more efficient erase cycles.

It is also noted that the use of lower programming, read, and erasure voltages allow for greater cell resistance to write fatigue, due to less energy and thus lower resulting damage to the underlying semiconductor materials. This allows for greater floating gate memory cell lifespan and a greater overall lifespan for the memory itself.

In one example embodiment, a memory device utilizes Vcc of 1.8V for a read pass-through voltage that is applied to the control gates of the unselected memory cells of a selected NAND memory cell string, and −1V for the read control gate voltage of the selected cell to be read. In a programming operation, the embodiment utilizes 7V as a pass-through control gate voltage for an unselected memory cell of the selected NAND memory string and 17V for a programming control gate voltage for the memory cell selected for programming.

It is noted that the above example is for illustrative purposes and that other NAND memory devices, arrays, and memory strings of embodiments of the present invention that utilize different voltages are possible and should be apparent to those skilled in the art with the benefit of the present disclosure.

The lowered operating voltages of embodiments of the present invention allow the use of lower voltage charge pumps that are more power efficient and are able to more readily supply current to the memory array. As the supplied voltages over Vcc are lower, these pumps can more easily provide higher output currents and can more easily come up to voltage from an off or standby condition. In addition, because of their lower provided voltages and higher output current capabilities, the lower voltage charge pumps can more easily overcome the RC time constants of circuit elements, allowing the memory to operate faster. However, because of the use of depletion mode floating gate FET memory cells and/or other depletion mode FETs, embodiments of the present invention may also require the use of negative voltages and therefore require one or more negative voltage charge pumps. In one such embodiment, a negative program voltage is utilized on the channel or bitline to program a memory cell and allow a reduction in the word line program voltage and/or pass voltages as a consequence.

As stated above, the reduced read and programming voltages additionally allow for reduction of the designed voltage limit margins of circuit elements and architecture. This allows for a reduction in the required feature sizes and layouts of the memory array and its supporting circuits. The elements and circuit architectures that can reduced or designed to lower voltage tolerances in embodiments of the present invention include, but are not limited to, smaller diffusions for circuit elements (such as source and drain regions of FETs), reduced insulation thicknesses, reduced FET gate oxide/insulation thicknesses, shallower diode junctions, lesser device spacing/separations, smaller high voltage decoder circuits and control gate high voltage driver circuits, and other memory support circuits, and smaller voltage isolation tubs or regions. This reduction in operating voltages is particularly an issue as the feature size reductions, oxide thicknesses, and operating voltages of modern integrated circuit manufacturing processes are reduced and the engineering and design methodologies to allow these modern processes to operate at elevated voltages become more and more extreme. It is noted that an additional benefit of the reduction in required circuit element feature sizes and high voltage architecture is in increased operational characteristics and programming speed and throughput in memory embodiments of the present invention.

In particular, in one embodiment of the present invention, a reduction in the likelihood of voltage breakdown of the select gates of the NAND string is accomplished through use of a depletion mode select transistor. The N− or P− depletion region of the channel in depletion mode transistors spread out the N+ or P+ source and drain junctions of the transistor, making the junction more gradual in profile. The use of a depletion mode select transistor in a NAND memory cell string allows the voltage differential between the channel of the string and the coupled bitline and/or source line of the NAND memory array during programming or read operations to be spread across this gradual junction. This takes the voltage of the electric field at the source or drain junction of the select transistor which is coupled to the channel of the string and spreads it across the gradual junction of the depletion mode select transistor, decreasing the specific electric field intensity in the junction and the likelihood of junction breakdown.

As stated above, in embodiments of the present invention, cell inhibit of unselected cells is increased with the utilization of depletion mode floating gate memory cells during programming and reduces the likelihood of cell disturb in the memory array. Since the channel is already formed there is no need to form the channel with precharging. This means that with depletion cells a better coupling of channel to gate and channel to control gate is expected. The increased coupling will help inhibited memory cells by reducing the voltage differential between the channel of the inhibited memory cell of an unselected NAND memory string and the programming voltage applied to the commonly coupled word line to program the selected memory cell in the selected NAND memory string. This improvement in inhibit characteristics make the depletion mode NAND memory strings of the present invention particularly advantageous in multi-level memory devices. In multi-level flash memory devices, multiple bits of data are encoded in each floating gate memory cell by programming the memory cell to more than two threshold voltage levels. These multiple valid threshold voltage levels in each memory cell are particularly susceptible to program and read disturb.

In addition, the coupling ratio between the floating gate and channel/control gate and channel of the memory cells of the array is increased through the use of depletion mode floating gate FET memory cells. This increase in coupling ratio occurs because of the depletion channel of carriers present in the depletion mode memory cell that is to be inhibited, which, unlike a comparable enhancement mode memory cell, does not have to be generated. This increased coupling ratio of the depletion mode memory cell increases the coupling of the channel in the unselected NAND memory cell string, allowing it to better couple upwards with the applied programming voltage. This improved coupling allows a higher voltage to be induced on the channel of the inhibited memory cell, further reducing the voltage differential between its channel and the applied programming voltage on its control gate from the coupled word line.

NAND memory embodiments of the present invention also increase memory array operation speed and characteristics resulting from the utilization of depletion mode floating gate FET memory cells. As stated above, the lower $r_{ds}$ of the depletion mode NAND memory string results in increased current flow through the memory string during read operations, allowing it to sink current from a coupled bitline at an increased rate resulting in a faster and more accurate read result. The pre-existing channel of the depletion mode NAND memory string and lowered read and write operation voltages due to the decreased threshold voltages allow the quick placement of the depletion mode NAND memory string in condition for a read and/or write operation. The lowered operating voltages also allow for reduction of the design voltage limits of circuit elements, feature sizes, and circuit architecture and layout spacing, reducing the RC time constants and increasing the responsiveness of these circuits. Additionally, the reduced read/write voltage levels also increase speed of operation by increasing the ability of memory embodiments of the present invention to reducing the voltage ramp times through the RC time constants of circuit lines and circuit loads through lower voltage swings and an increased current supply from more efficient power supplies (lower voltage charge pumps or Vcc). In particular, the voltage ramp times through word line RC time constants, a major limiting factor in memory speed, can be more easily overcome because of lowered operating voltages. The use of more efficient power supplies and current sources also allows for the voltage levels to more quickly come up to operation levels after power-up or from standby.

As stated above, with Flash memory programming in general, the memory cells are programmed by applying a high voltage across the control gate and the source, drain, and/or channel of a selected floating gate transistor/memory cell to tunnel carriers into the electrically isolated "floating gate" within the memory cell. A floating gate memory cell in an erased state, with a lack of carriers in the floating gate (a lack of electrons), typically signifies a logic bit "1." A "programmed" floating gate memory cell state, with additional carriers on the floating gate, typically represents a logic bit "0." Generally, in programming a row of memory cells, the drain, source, and/or channel of the individual memory cells are supplied with either a "program" voltage or a "program-inhibit" voltage, as desired. A gate programming voltage is then established on the word line that it is connected to and forms the control gates of the selected row of memory cells to program the individual floating gate memory cells of the row in either a programmed state or keep them in an erased state by inhibiting programming by the applied bitline voltage (logical "0" or a logical "1"). In other words, to change the state of the erased cell, the voltage differential between the high gate programming voltage on the control gate of the selected memory cell and the program voltage applied to the channel through the bitline is enough to tunnel electrons into the floating gate of the selected memory cell and change it to a programmed state. Whereas, the voltage differential between the high gate programming voltage on the control gate of the selected memory cell and the program-inhibit voltage applied on the channel is not enough to tunnel electrons into the floating gate of the selected memory cell and leaves it unchanged or "inhibited."

In embodiments of the present invention, the depletion mode memory cells of the NAND memory strings already have a channel established, allowing for the precharge of the channels of the cells of the string to be less than prior art enhancement mode NAND memory strings. This allows a shorter precharge duration and/or voltage to establish the required channel, or, in other embodiments of the present invention, no precharge step is required at all. In addition, the channel that is established is more uniform and of higher quality across the memory cells of the depletion mode NAND memory string, due to the pre-existing depletion channel and the lower channel resistance.

In NAND architecture Flash memory embodiments of the present invention with depletion mode floating gate FET memory cells, a boosted bitline programming process is accomplished by placing either a "program" voltage or a "program-inhibit" voltage, as desired, on the bitlines connected to the series connected strings containing the floating gate memory cells to be programmed. The drain select gate is also turned on, allowing the voltage from the bitlines to be connected to "precharge" the channels of the serial strings. This precharge voltage is of a lower voltage and/or duration than that required by prior art boosted bitline programming of enhancement mode NAND memory strings and results in a higher quality, more uniform precharged channel in the depletion mode NAND memory string with less applied voltage and in less time. This channel is also, in one embodiment of the present invention, precharged and established at lower voltage, allowing a greater programming voltage differential to be applied. Once the channel is established, a high gate programming voltage is then established on the word line that is connected to the control gates of the selected row of memory cells. A high, but non-programming level voltage (a pass voltage) is established at the same time on the word lines of the remaining floating gate memory cells of the selected series connected strings. This high pass voltage has the effect of turning the remaining unselected memory cells of the selected string to an "on" condition regardless of the programmed state of their internal floating gate, allowing them to pass the "program" or "program-inhibit" voltage that was placed on the individually connected bitline to the selected memory cell of the individual series strings being programmed. The gate programming voltage on the selected row of memory cells then programs them to either a programmed state or keeps it unchanged in an inhibited state (logical "0" or a logical "1") dependent on the connected program/program-inhibit voltage placed on the connected bitlines.

Figure 3:
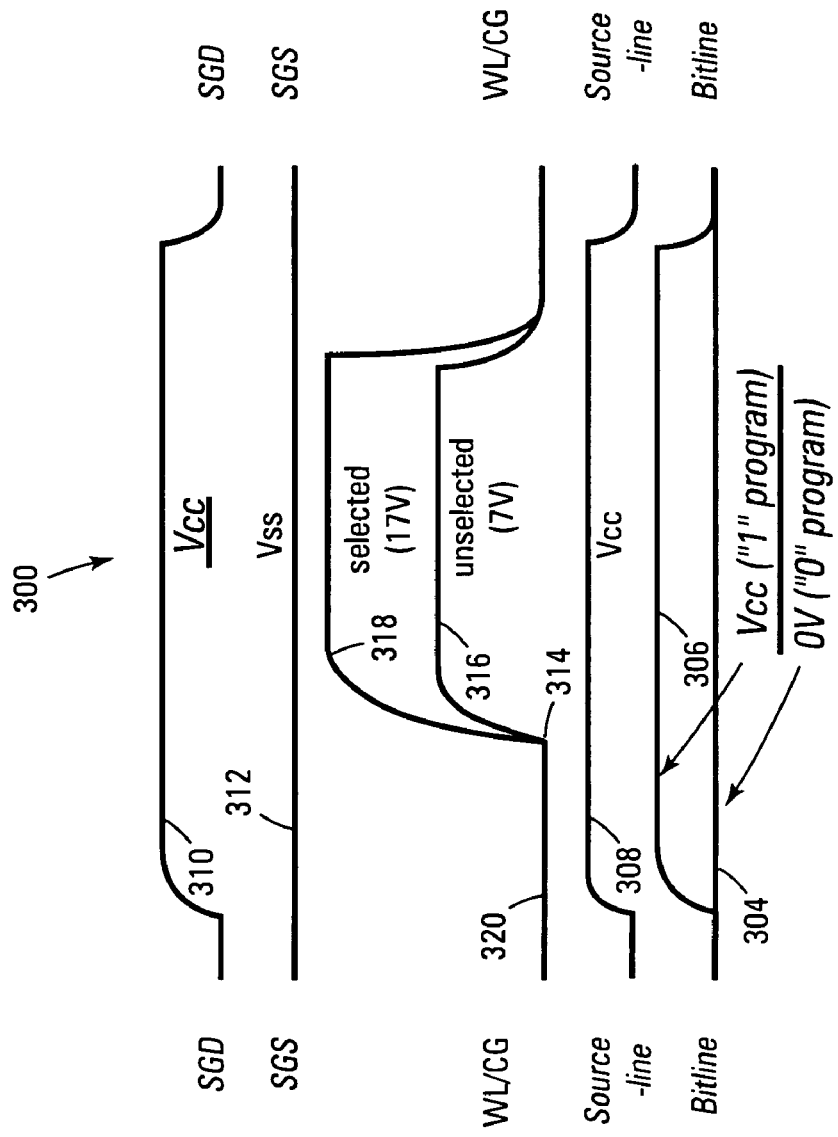
FIG. 3 is a waveform diagram detailing a boosted bitline programming operation of a depletion mode NAND Flash memory device in accordance with an embodiment of the present invention.

FIG. 3 show waveforms 300 of a depletion mode NAND Flash architecture floating gate memory string embodiment of the present invention in a boosted bitline programming operation 300 with program and program inhibit voltages. In FIG. 3, a program voltage of 0V (program logical 0) 304 or program-inhibit voltage of Vcc (1.8V) (program logical 1) 306 is placed on the bitline 302, 208. A voltage of Vcc 310 is applied to the gate of the drain select gate 212 on the drain select gate control line 214, enabling it and precharging the voltage on the bitline 302, 208 (either Vcc program-inhibit voltage 306 or 0V program voltage 304) to the serial string of floating gate memory cells 204. A voltage of Vss 312 is applied to the gate of the source select gate 216 on the source select gate control line 218, keeping it turned off and isolating the source line 206 (which has been brought to a voltage of Vcc 308) from the serial string of memory cells 204. After a selected time period 314, a high gate programming voltage of 17V 318 is applied to the control gate of the selected floating gate cell 202 on its word line 320, 210, while a pass voltage of 7V 316 is applied to the control gates of the unselected floating gate memory cells 202 of the serial string 204. The voltage differential between the 17V gate programming voltage 318 on the control gate of the selected memory cell 202 and the 0V program voltage 304/Vcc program-inhibit voltage 306 of the bitline 302, 208 programs/program-inhibits the floating gate of the selected memory cell 202. In programming, Vcc bitline voltage precharges carriers in the channel of the serial string of floating gate memory cells 204. To inhibit programming, the bitline associated with the inhibited string is kept at a high or Vcc level and then as the 17V gate programming voltage 318 is ramped on the control gate of the selected memory cell 202 the channel will couple up and the source of the drain select gate will rise and turn off the drain select gate 212 subsequently trapping the charge in the channel. The trapped charge is capacitively coupled upwards by the 17V gate programming voltage 318 on the control gate of the selected memory cell 202 decreasing the programming voltage differential between the carriers of the channel and the 17V gate programming voltage 318. For a string that is to be programmed and not inhibited, a 0V bitline voltage allows the drain select gate 212 to remain in an on state, connecting the channel of the serial string of floating gate memory cells 204 to the 0V applied to the bitline. This clamps the channel to 0V to maintain the programming voltage differential between the channel of the serial string of floating gate memory cells 204 and the 17V gate programming voltage 318 to tunnel carriers into the isolated floating gate.

In another NAND architecture Flash memory embodiment of the present invention, another approach to programming is the boosted source line programming process, accomplished by placing precharge voltage on the source line connected to the serial strings. The source control gates are also turned on to connect the voltage to the serial strings. A "program" voltage or a "program-inhibit" voltage, as is desired, is established on the bitlines connected to the series connected strings containing the floating gate memory cells to be programmed, but is not connected to the selected serial strings. While the precharge voltage is available on the connected source line, a high gate programming voltage is established on the word lines the selected floating gate memory cells and a high pass voltage is established on the word lines of the non-selected floating gate memory cells of the series connected strings. This turns on the floating gate transistor memory cells of the strings and establishes/precharges a channel of carriers in them (typically electrons in N-FET floating gate transistors). This precharge voltage is of a lower voltage and/or applied for a shorter duration than that required by prior art boosted source line programming of enhancement mode NAND memory strings and results in a higher quality, more uniform precharged channel in the depletion mode NAND memory string with less applied voltage and in less time. This channel is also, in one embodiment of the present invention, precharged and established at lower voltage, allowing a greater programming voltage differential and/or a lower high gate programming voltage to be applied.

Once the channel has been precharged in the selected serial strings, the source control gates are turned off, unconnecting the precharge voltage from the serial strings. The drain select gates are then turned on, allowing the program voltage or program-inhibit voltage to be connected to the selected series connected strings from the bitlines. A bitline that is connected to 0V will drain the precharged channel and prepare the selected cell to be programmed. A high level or Vcc on the bitline will inhibit the selected cell on the selected word line. The voltage differential between the control gate and the channel on the selected memory cells then programs them to either a programmed state or an inhibited state (logical "0" or a logical "1") dependent on the connected program/program-inhibit voltage placed on the connected bitlines.

Figure 4:
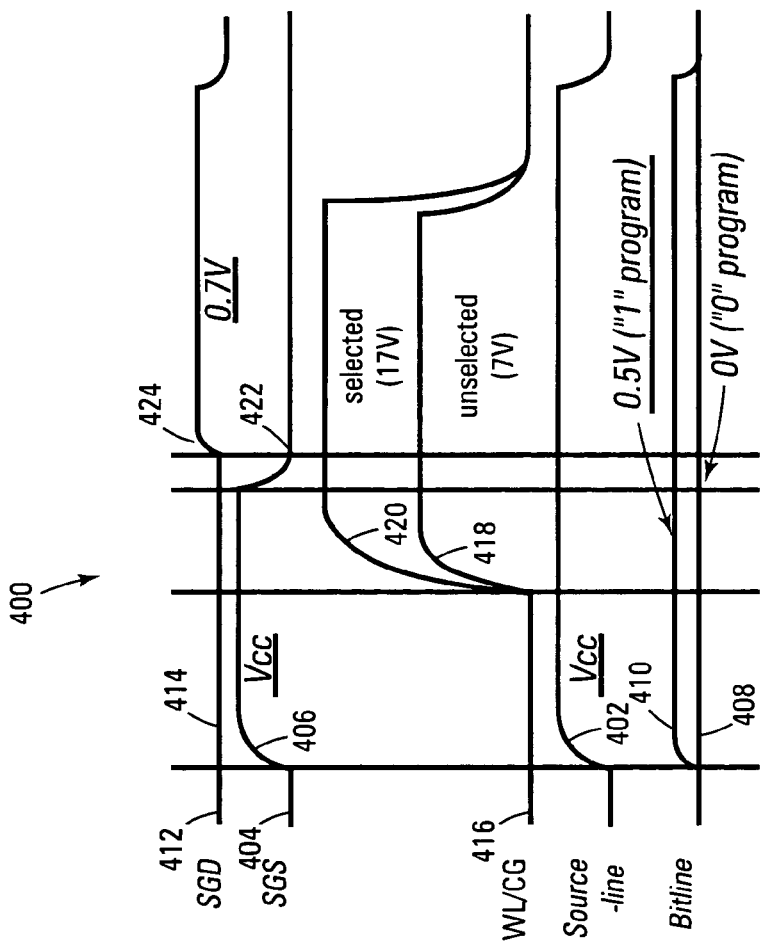
FIG. 4 is a waveform diagram detailing a boosted source line programming operation of a depletion mode NAND Flash memory device in accordance with an embodiment of the present invention.

FIG. 4 shows waveforms 400 of a depletion mode NAND Flash architecture floating gate memory string of an embodiment of the present invention in a boosted source line programming operation with program and program inhibit voltages. In FIG. 4, the NAND architecture floating gate series string 204 is precharged by a Vcc (in this embodiment 1.8V) voltage 402 on the source line 206 that is connected to the serial strings 204 through the source control gates 216 which are turned on by a Vcc voltage 406 placed on source select gate control line 404, 218. At the same time, a "program" voltage of 0V 408 or a "program-inhibit" voltage of 0.5V 410, as is desired, is established on the bitlines 208 connected to the series connected strings 204 containing the floating gate memory cells 202 to be programmed. The program 408 or program-inhibit 410 voltages, however, are isolated from the selected serial strings 204 by the drain control gates 216, which are turned off by 0V 414 that is placed on the drain select gate control line 412, 214. While the precharge voltage of Vcc 402 is available on the connected source line 206, a high gate programming voltage of 17V 420 is established on the word lines 416, 210 of the selected floating gate memory cells 202 and a high pass voltage 418 is established on the word lines 416, 210 of the non-selected floating gate memory cells 202 of the series connected strings 204. This turns on the N-FET floating gate transistor memory cells 202 of the strings 204 and establishes/precharges a channel of electrons in them. Once the channel has been precharged in the selected serial strings 204, the source control gates 216 are turned off by placing 0V 422 on the source select gate control line 404, 218, unconnecting the precharge voltage of Vcc 402 of the source line 206 from the serial strings 204. A near threshold voltage of 0.7V 424 (assuming a 0.6V threshold drain select gate transistor) is then applied to the drain select gate control line 412, 214. If the applied bitline 208 voltage is the program voltage of 0V the drain select gate 212 turns on and discharges the precharged channel of the serial string of floating gate memory cells 204 to 0V 408. Alternatively, if the applied bitline voltage is the program-inhibit voltage of 0.5V 410, or higher, the drain select gate 212 remains off and the carrier charge in the channel stays trapped and is capacitively coupled upwards by the applied gate programming voltage 420, 418. The high gate programming voltage of 18V 420 on the selected memory cells 202 programs the memory cells 202 to either a programmed state or an inhibited state (logical "0" or a logical "1") dependent on the connected program 408/program-inhibit 410 voltage placed on the bitlines 208.

In a further depletion mode NAND architecture Flash memory embodiment of the present invention, a boosted substrate tub or boosted substrate programming process (referred to herein as boosted tub programming) is utilized to precharge the channel of the selected serial strings of floating gate memory cells and program the selected memory cells with a gate programming voltage connected to the gates of the selected memory cells with which to tunnel carriers. Boosted tub programming is described in U.S. patent application Ser. No. 10/663,277, filed on Sep. 16, 2003, titled "BOOSTED SUBSTRATE/TUB PROGRAMMING FOR FLASH MEMORIES", and is commonly assigned. In boosted tub programming, the substrate or substrate "tub" (referred to herein as the "tub") is raised to an elevated voltage level to stably and uniformly precharge the channels and source and drain nodes of the floating gate transistor memory cells of each serial string with carriers. The carriers are coupled to the channels of the serial strings through the intrinsic diode formed between the source, drain, and channel of each floating gate transistor memory cell and the substrate tub. A high pass voltage is then applied to the gates of the non-selected floating gate memory cells and a high gate programming voltage to the selected memory cells, allowing the selected memory cells to be programmed in correspondence to a program or program-inhibit voltage placed on the bitlines.

This precharging of the channels with the substrate tub in boosted tub programming allows for lower voltages to be utilized with the bitline circuits, source line circuits, decoders, and sense amplifiers/drivers of the floating gate memory array. The lower operating voltages of these circuits allow for smaller circuits and device feature sizes to be used in these devices, which in turn allows for a smaller Flash/floating gate memory device to be designed. Boosted tub programming also allows for reuse of the high voltage circuits in the substrate/substrate tub that are utilized for programming and bulk erasure of the erase blocks of the NAND Flash architecture floating gate memory array. Additionally, boosted tub programming allows for more specific control of the precharge voltage than in a boosted bitline or boosted source line programming methods, with their more complex circuit paths and multiple intervening circuit nodes. Because of this reduced intervening circuit complexity, the tub voltage can also be more easily and more uniformly optimized for programming and minimum disturb. The boosted tub programming approach also establishes a more uniform and stable channel in the strings of floating gate memory cells regardless of their individual programmed states, allowing for better control and precision in the programming operation. In addition, the precharge voltage in the depletion mode NAND memory string is of a lower voltage and/or duration than that required by prior art enhancement mode NAND memory strings and results in a high quality precharged channel in the depletion mode NAND memory string with less applied voltage and in less time. This channel can also be precharged and established at lower voltage, allowing a greater programming voltage differential and/or a lower high gate programming voltage to be applied.

In programming a depletion mode NAND architecture Flash memory with a boosted tub programming approach, the substrate tub 252 is raised to a selected precharge voltage level. At the same time, a similar level voltage is placed on the bitlines 208 and source line 206 connected to the selected serial strings of floating gate memory cells 204. Alternatively, the bitlines 208 and source line 206 can be placed in high impedance mode (Hi Z) and allowed to float up with the elevated voltage of the substrate tub 252 instead of being driven with a separate voltage. The selected precharge voltage applied to the substrate tub 252 flows through the intrinsic diodes (not shown) formed in each floating gate transistor 202 by the junction of the source and drain N+ diffusions and the P doped substrate tub 252. The voltage seen at each floating gate transistor 202 (the substrate tub 252 precharge voltage, less a diode drop) precharges a channel of carriers in the floating gate transistor 202. A portion of this channel voltage will remain (the precharge voltage less a diode drop will be affected by capacitive coupling and so will be reduced by the coupling ratio of the channel to the total capacitance due to the intrinsic diode depletion region, control gate, and source and drain nodes) after the precharge voltage is removed from the substrate tub 252 because of the intrinsic diodes.

After the channels of the floating gate transistor memory cells of the serial strings are precharged, the applied voltage on the substrate tub 252 is lowered. At the same time, a high gate programming voltage is established on the word line 210 of the selected floating gate memory cells 202 and a high pass voltage is established on the word lines 210 of the non-selected floating gate memory cells 202 of the series connected strings 204. Additionally, "program" voltage or a "program-inhibit" voltage, as is desired, is established on the bitlines 208 connected to the series connected strings 204 containing the floating gate memory cells 202 to be programmed. A "program" bitline voltage turns on the drain select gate 212, discharging the precharged channel of the selected series connected strings 204 and allowing the selected floating gate memory cells 202 to be programmed. A "program-inhibit" bitline voltage places the drain select gate 212 in an off state and traps the precharged carriers in the channel of the selected serial string of floating gate memory cells 204 allowing them to capacitively couple upwards in voltage and prevent programming of the floating gate memory cells 202 of the selected serial string 204. The gate programming voltage on the selected memory cells 202 then programs the selected floating gate memory cells 202 of the serial string 204 to either a programmed state or an inhibited state (logical "0" or a logical "1"), dependent on the program or program-inhibit voltage placed on the connected bitlines 208.

Figure 5:
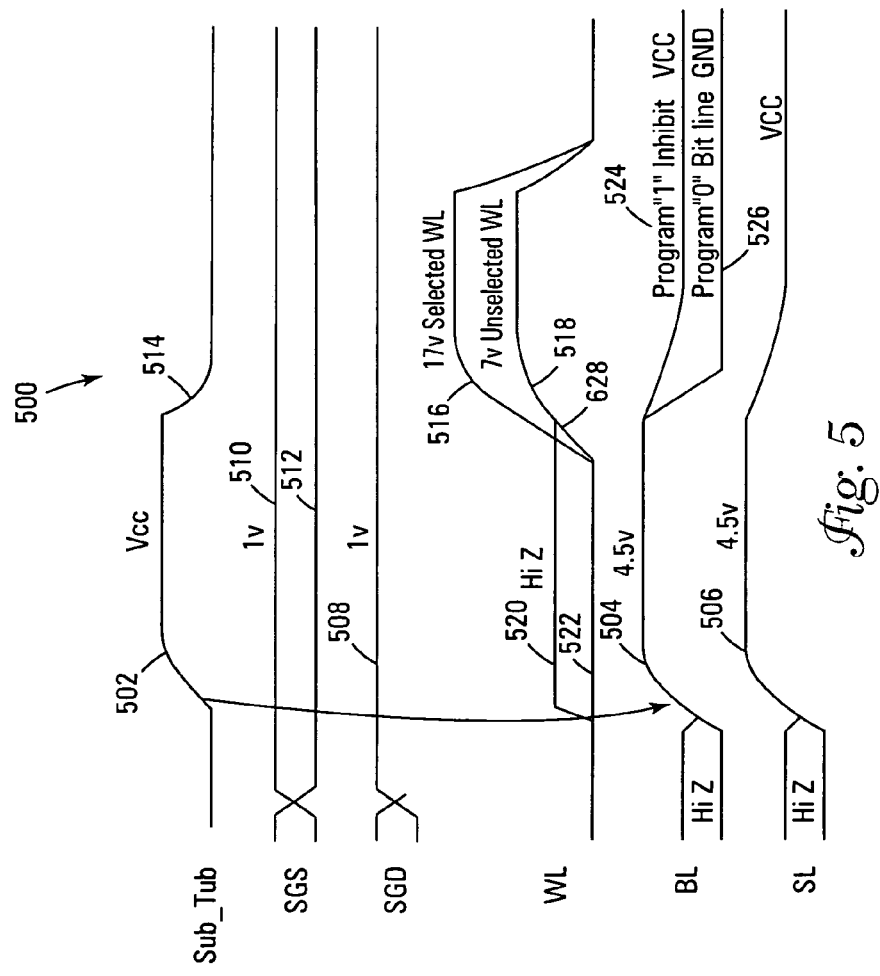
FIG. 5 is a waveform diagram detailing a boosted tub programming operation of a depletion mode NAND Flash memory device in accordance with an embodiment of the present invention.

FIG. 5 shows waveforms 500 of a depletion mode NAND Flash architecture floating gate memory array in a boosted tub programming operation with program and program inhibit voltages. In FIG. 5, the depletion mode NAND architecture floating gate cell 202 series strings 204 are precharged through their source/drain well intrinsic diodes by a Vcc voltage 502 on the substrate tub 252. At the same time, the bitlines 208 and source line 206 connected to the selected serial strings 204 of floating gate memory cells 202 are placed into a high impedance mode and allowed to follow the P+substrate tub 252 precharge voltage, less a diode drop 504, 506. Alternatively, a selected voltage, such as 4.5V, 504, 506 can be placed on the bitlines 208 and source line 206 connected to the selected serial strings 204 of floating gate memory cells 202. The floating or low voltage bitlines 208 and source line 206 that are not driven or are minimally driven allow for the use of low voltage circuit devices with smaller device feature sizes in the bitline and source line circuitry, decode circuitry, and any supporting circuitry.

As shown in FIG. 5, in the boosted tub programming operation, the drain select gates 212 are turned on by a 1V voltage 508 applied to the drain select gate control line 214, allowing the bitline voltage 504 to be connected to the selected series connected strings 204 from the bitlines 208. The source select gates 216 are turned off by a 0V voltage 512 applied to the source select gate control line 218, isolating the 4.5V voltage 506 of the source line 206 from the selected series connected strings 204. Alternatively, to decrease the possibility of punch through damage of the source select gates 216, the source select gates 216 are turned on by a 1V voltage 510 applied to the source select gate control line 218, allowing the 4.5V voltage 506 to be connected to the selected series connected strings 204 from the source line 206. The word lines 210 of the floating gate memory cells 202 of the series connected strings 204 are kept at 0V 522 or placed in a high impedance mode and allowed to float 520. The Vcc precharge voltage 502 applied to the substrate tub 252 flows through the intrinsic diodes (not shown) formed in each floating gate transistor 202 between the channel, source well, and drain well and the substrate tub 252. The voltage seen at each floating gate transistor 202 (the substrate tub 252 precharge voltage less a diode drop) precharges a channel of carriers in the floating gate transistor 202. It is noted that the intrinsic diodes of the channel, source, and drain allow the precharge voltage and generated carrier channel to be retained in the channel after the precharge voltage is removed.

As the substrate tub 252 precharge voltage of Vcc 502 is lowered and the substrate tub 252 discharges 514, a high gate programming voltage of 17V 516 is applied on the word lines 210 of the selected floating gate memory cells 202 and a high pass voltage of 7V 518 is applied on the word lines 210 of the non-selected floating gate memory cells 202 of the series connected strings 204, turning them on. After, or at the same time, the desired "program" voltage of 0V 526 or "program-inhibit" voltage of Vcc 524 is established on the bitlines 208 connected to the series connected strings 204. The voltage placed on the connected bitlines 208 in combination with the gate programming voltage of 17V 516 traps the precharged carriers in the channel of the selected serial strings 204 or discharges them and thus programs the selected floating gate memory cells 202 to either a programmed state or an inhibited state (logical "0" or a logical "1").

It is noted that in the depletion mode NAND architecture Flash memory device embodiment of the present invention shown in FIG. 5, the boosted tub Vcc voltage 502 is removed slightly after the high select 7V word line voltage 518 and the gate programming 17V word line voltage 516 are applied, such that word line voltages have already reached approximately 5V or 6V. This allows for better coupling of the precharged channel to the programming voltages. However, it is noted that the relative timing of the word line voltages 516, 518, the substrate tub voltage 502, and the bitline voltages 524, 526 in other embodiments of the present invention may vary allowing for differing optimization of the precharge values, coupling characteristics, and inhibit characteristics.

In yet a further embodiment of the present invention, a depletion mode NAND memory string is programmed without a precharge step utilizing the inherent depletion channel in the depletion mode floating gate FET memory cells of the depletion mode NAND string. In this embodiment, the precharge step of the boosted bitline, boosted source line, and boosted tub programming processes is eliminated and the selected memory cells directly programmed. In this, a high gate programming voltage of 17V is applied on the word lines 210 of the selected floating gate memory cells 202 and a high pass voltage of 7V is applied on the word lines 210 of the non-selected floating gate memory cells 202 of the series connected strings 204, turning them on. After, or at the same time, the desired "program" voltage of 0V or "program-inhibit" voltage of Vcc is established on the bitlines 208 connected to the series connected strings 204. The voltage placed on the connected bitlines 208 in combination with the gate programming voltage of 17V programs the selected floating gate memory cells 202 to either a programmed state or an inhibited state (logical "0" or a logical "1").

It is noted that other programming voltage levels, sequences, and optimizations are possible for the boosted bitline, boosted source line, boosted tub, and non-precharge depletion mode NAND architecture Flash programming methods.

It is also noted that other depletion mode NAND memory cell strings, arrays, programming voltage levels and sequences incorporating embodiments of the present invention are possible and should be apparent to those skilled in the art with the benefit of this disclosure.

CONCLUSION

NAND architecture Flash memory strings, memory arrays, and memory devices has been described that utilize depletion mode floating gate memory cells and/or select gates. Depletion mode floating gate memory cells allow for increased cell current through lower channel $r_{ds}$ resistance and decreased "narrow width" effect, allowing for increased scaling of NAND memory cell strings. In addition, the required voltages for reading and programming operations is reduced, allowing the use of more efficient, lower voltage charge pumps and a reduction circuit element feature sizes and layouts. Cell inhibit of unselected cells is also increased, reducing the likelihood of cell disturb in the memory array. Operation speed is improved by increasing read current of the selected NAND string and by increasing the ability to overcome the RC time constants of circuit lines and capacitances through lowered voltage swings and increased current supplies. In one embodiment of the present invention, a reduction in the likelihood of voltage breakdown of the select gates of the NAND string are accomplished through use of a depletion mode select transistor. In other embodiments of the present invention, a NAND string of depletion mode floating gate transistor is programmed utilizing boosted bitline, boosted source line, boosted tub, or non-precharge programming, allowing generation of a channel that is adjustable and of a more uniform nature.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A depletion mode NAND architecture floating gate memory cell string comprising:

a NAND architecture floating gate memory cell memory string formed on a substrate having a plurality of depletion mode floating gate memory cells are coupled in a source to drain coupled arrangement in a serial string, wherein the plurality of depletion mode floating gate memory cells have a native UV erased threshold voltage (UV-Vth) that is negative and where a pre-existing channel of carriers is formed in the depletion mode floating gate memory cells of the depletion mode NAND architecture floating gate memory cell string in a depletion channel;

wherein the depletion mode NAND architecture floating gate memory cell string is adapted to program a selected floating gate memory cell by applying a floating gate programming voltage on a control gate of the selected floating gate memory cell and applying a program voltage or a program-inhibit voltage that is selectively coupled to the pre-existing depletion channel in the depletion mode NAND architecture floating gate memory cell string.

2. The depletion mode NAND architecture floating gate memory cell string of claim 1, further comprising:

a plurality of word lines, wherein each word line is coupled to a gate of a depletion mode floating gate memory cell of the string;

a bitline, wherein the bitline is coupled to a drain of a first depletion mode floating gate memory cell of the string; and a source line, wherein the source line is coupled to a source of a last depletion mode floating gate memory cell of the string.

3. The depletion mode NAND architecture floating gate memory cell string of claim 2, wherein the bitline is coupled to the drain of the first depletion mode floating gate memory cell through a depletion mode select gate transistor.

4. The depletion mode NAND architecture floating gate memory cell string of claim 2, wherein the source line is coupled to the source of the last depletion mode floating gate memory cell through a depletion mode select gate transistor.

5. The depletion mode NAND architecture floating gate memory cell string of claim 2, wherein the bitline is coupled to the drain of the first depletion mode floating gate memory cell through an enhancement mode select gate transistor.

6. The depletion mode NAND architecture floating gate memory cell string of claim 2, wherein the source line is coupled to the source of the last depletion mode floating gate memory cell through an enhancement mode select gate transistor.

7. The depletion mode NAND architecture floating gate memory cell string of claim 1, wherein the depletion mode floating gate memory cells are depletion mode N-FET or P-FET floating gate transistors.

8. The depletion mode NAND architecture floating gate memory cell string of claim 1, wherein each depletion mode floating gate memory cell is adapted to store multiple bits of data in a multi-level floating gate memory cell.

9. The depletion mode NAND architecture floating gate memory cell string of claim 1, wherein the NAND architecture floating gate memory cell memory string is formed in a substrate tub, where the substrate tub is formed on the substrate.

10. The depletion mode NAND architecture floating gate memory cell string of claim 1, wherein the NAND architecture floating gate memory cell memory string is a NAND resistive string, where a single channel depletion region is formed underlying a floating gate and a control gate of the depletion mode floating gate memory cells.

11. A depletion mode NAND architecture Flash memory array comprising:
a NAND architecture memory array formed on a substrate having a plurality of depletion mode floating gate memory cells arranged in rows and columns in a plurality of erase blocks, wherein the plurality of depletion mode floating gate memory cells are serially coupled in a source to drain coupled arrangement into a plurality of NAND memory cell strings, wherein the plurality of depletion mode floating gate memory cells have a negative UV erased state threshold voltage (UV-Vth);
a plurality of word lines, wherein each word line is coupled to one or more gates of a row of the depletion mode floating gate memory cells;
a plurality of bitlines, wherein each bitline is coupled to a first floating gate memory cell of one or more strings through a drain control gate transistor; and
at least one source line, wherein the at least one source line is coupled to a last floating gate memory cell of one or more strings through a source control gate transistor;
wherein the plurality of NAND memory cell strings have a pre-existing channel of carriers formed in the depletion mode floating gate memory cells of the plurality of NAND memory cell strings in a depletion channel; and wherein the depletion mode NAND architecture Flash memory array is adapted to program a selected number of the depletion mode floating gate memory cells of a selected number of NAND memory cell strings by applying a floating gate programming voltage on a word line coupled to a selected memory cell of each selected NAND memory cell string and applying a program voltage or a program-inhibit voltage that is selectively coupled to the existing depletion channel in each selected NAND memory cell string.

12. The depletion mode NAND architecture Flash memory array of claim 11, wherein the each bitline is coupled to the drain of the first floating gate memory cell of one or more strings through a depletion mode select gate transistor.

13. The depletion mode NAND architecture Flash memory array of claim 11, wherein the at least one source line is coupled to the source of the last depletion mode floating gate memory cell of each of one or more strings through a depletion mode select gate transistor.

14. The depletion mode NAND architecture Flash memory array of claim 11, wherein the depletion mode floating gate memory cells are depletion mode N-FET or P-FET floating gate transistors.

15. The depletion mode NAND architecture Flash memory array of claim 11, wherein each erase block of the NAND architecture Flash memory array is formed in a substrate tub, where each substrate tub is formed on the substrate.

16. The depletion mode NAND architecture Flash memory array of claim 11, wherein one or more of the plurality of NAND architecture floating gate memory cell memory strings is a NAND resistive string, where a single channel depletion region is formed underlying a floating gate and a control gate of the depletion mode floating gate memory cells.

17. The depletion mode NAND architecture Flash memory array of claim 11, wherein the memory array is adapted to further precharge the depletion channel in the floating gate memory cell strings with a precharge voltage on the substrate and program a selected number of floating gate memory cells by applying a floating gate programming voltage on the word line of each selected memory cell and a program voltage or a program-inhibit voltage that is selectively coupled to the floating gate memory cell strings.

18. The depletion mode NAND architecture Flash memory array of claim 11, wherein the memory array is adapted to further precharge the depletion channel in the floating gate memory cell strings with a precharge voltage on the at least one source line and program a selected number of floating gate memory cells by applying a floating gate programming voltage on the word line of each selected memory cell and applying a program voltage or a program-inhibit voltage that is selectively coupled to the floating gate memory cell strings after uncoupling the precharge voltage.

19. The depletion mode NAND architecture Flash memory array of claim 11, wherein the memory array is adapted to further precharge the depletion channel in the floating gate memory cell strings with a program voltage or a program-inhibit voltage that is selectively coupled to the floating gate memory cell strings and program a selected number of floating gate memory cells by applying a floating gate programming voltage on the word line of each selected memory cell.

20. A depletion mode NAND architecture Flash memory device comprising:
a NAND architecture memory array formed on a substrate having a plurality of depletion mode floating gate memory cells arranged in rows and columns in a plurality of erase blocks, wherein the plurality of floating gate memory cells are serially coupled in a source to drain coupled arrangement into a plurality of NAND memory cell strings, wherein the plurality of depletion mode floating gate memory cells have an ultra-violet erased threshold voltage (UV-Vth) that is negative when no charge is stored in the depletion mode floating gate memory cells;
a control circuit;
a row decoder coupled to a plurality of word lines, wherein each word line is coupled to one or more gates of a row of the floating gate memory cells;
a plurality of bitlines, wherein each bitline is coupled to a first floating gate memory cell of one or more strings through a drain control gate transistor; and
at least one source line, wherein the at least one source line is coupled to a last memory cell of one or more strings through a source control gate transistor;
wherein the plurality of NAND memory cell strings have a pre-existing channel of carriers formed in the depletion mode floating gate memory cells of the plurality of NAND memory cell strings in a depletion channel; and
wherein the control circuit of the depletion mode NAND architecture Flash memory device is adapted to program a selected number of the depletion mode floating gate memory cells of a selected number of NAND memory cell strings by applying a floating gate programming voltage on a word line coupled to a selected memory cell of each selected NAND memory cell string and applying a program voltage or a program-inhibit voltage that is selectively coupled to the existing depletion channel in each selected NAND memory cell string.

21. The depletion mode NAND architecture Flash memory device of claim 20, wherein the each bitline is coupled to the drain of the first floating gate memory cell of one or more strings through a depletion mode select gate transistor.

22. The depletion mode NAND architecture Flash memory device of claim 20, wherein the depletion mode floating gate memory cells are adapted to store multiple data bits as multi-level memory cells.

23. The depletion mode NAND architecture Flash memory device of claim 20, wherein one or more of the plurality of NAND architecture floating gate memory cell memory strings is a NAND resistive string, where a single channel depletion region is formed underlying a floating gate and a control gate of the depletion mode floating gate memory cells.

24. A system comprising:
a host coupled to a Flash memory device, wherein the Flash memory device comprises,
  a depletion mode NAND architecture memory array formed on a substrate having a plurality of depletion mode floating gate memory cells arranged in rows and columns and coupled into a plurality of NAND memory cell strings, wherein the plurality of depletion mode floating gate memory cells have a UV erased threshold voltage (UV-Vth) that is negative;
  a plurality of word lines, wherein each word line is coupled to one or more gates of a row of the floating gate memory cells;
  a plurality of bitlines, wherein each bitline is coupled to a drain of a first floating gate memory cell of one or more strings; and
  at least one source line, wherein the at least one source line is coupled to a source of a last floating gate memory cell of one or more strings;
  wherein the plurality of NAND memory cell strings have a pre-existing channel of carriers formed in the depletion mode floating gate memory cells of the plurality of NAND memory cell strings in a depletion channel; and
  wherein the system is adapted to program a selected number of the depletion mode floating gate memory cells of a selected number of NAND memory cell strings of the Flash memory device by applying a floating gate programming voltage on a word line coupled to a selected memory cell of each selected NAND memory cell string and applying a program voltage or a program-inhibit voltage that is selectively coupled to the existing depletion channel in each selected NAND memory cell string.

25. The system of claim 24, wherein the host is a processor.

26. The system of claim 24, wherein the host is a computer system.

27. A Flash memory device comprising:
a depletion mode NAND architecture memory array formed on a substrate having a plurality of depletion mode floating gate memory cells arranged in rows and columns and having a means for coupling into a plurality of NAND memory cell strings, wherein the plurality of depletion mode floating gate memory cells have a native threshold voltage (UV-Vth) that is negative when no charge is stored in the depletion mode floating gate memory cells;
a means for coupling a plurality of word lines to one or more gates of a row of the floating gate memory cells;
a means for coupling a plurality of bitlines to a drain of a first floating gate memory cell of one or more strings; and
a means for coupling at least one source line to a source of a last floating gate memory cell of one or more strings;
wherein the plurality of NAND memory cell strings have a pre-existing channel of carriers formed in the depletion mode floating gate memory cells of the plurality of NAND memory cell strings in a depletion channel; and
wherein the Flash memory device is adapted to program a selected number of the depletion mode floating gate memory cells of a selected number of NAND memory cell strings by applying a floating gate programming voltage on a word line coupled to a selected memory cell of each selected NAND memory cell string and applying a program voltage or a program-inhibit voltage that is selectively coupled to the existing depletion channel in each selected NAND memory cell string.

28. A method of making a NAND architecture memory array, comprising:
forming a plurality of depletion mode floating gate memory cells on a substrate, wherein the plurality of depletion mode floating gate memory cells are arranged in rows and columns into a plurality of erase blocks, and where the memory cells are coupled in a source to drain coupled arrangement into a plurality of NAND memory cell strings and where the plurality of depletion mode floating gate memory cells have a native UV erased threshold voltage (UV-Vth) that is negative;
forming a pre-existing channel of carriers in the depletion mode floating gate memory cells of the plurality of NAND memory cell strings in a depletion channel; and
forming a control circuit, wherein the control circuit of the NAND architecture memory array is adapted to program a selected number of the depletion mode floating gate memory cells of a selected number of NAND memory cell strings by applying a floating gate programming voltage on a word line coupled to a selected memory cell of each selected NAND memory cell string and applying a program voltage or a program-inhibit voltage that is selectively coupled to the existing depletion channel in each selected NAND memory cell string.

29. The method of claim 28, further comprising:
forming one or more substrate tubs under the plurality of erase blocks.

30. The method of claim 28, further comprising:
forming a plurality of word lines, wherein each of the plurality of word lines is coupled to one or more control gates of a row of the floating gate memory cells;
forming a plurality of bitlines, wherein each bitline is coupled to a drain of a first floating gate memory cell of one or more strings; and
forming at least one source line, wherein the at least one source line is coupled to a source of a last floating gate memory cell of one or more strings.

31. The method of claim 30, wherein forming the plurality of bitlines, wherein each bitline is coupled to the drain of the first floating gate memory cell of the one or more strings further comprises forming a drain select gate transistor to couple each bitline to the drain of the first floating gate transistor of the one or more strings.

32. The method of claim 31, wherein the drain select gate transistor further comprises a depletion mode FET.

33. The method of claim 30, wherein forming the at least one source line, wherein the at least one source is coupled to the source of the last floating gate memory cell of the one or more strings further comprises forming a source select gate transistor to couple the at least one source line to the source of the last floating gate transistor of the one or more strings.

34. The method of claim 33, wherein the source select gate transistor further comprises a depletion mode FET.

35. The method of claim 28, wherein forming the plurality of depletion mode floating gate memory cells on the substrate, wherein the plurality of depletion mode floating gate memory cells are arranged in rows and columns into a plurality of erase blocks, and where the memory cells are coupled in the source to drain coupled arrangement into the plurality of NAND memory cell strings further comprises forming the plurality of depletion mode floating gate memory cells, wherein the memory cells are coupled into the plurality of NAND memory cell strings, and where the floating gate memory cells of each NAND memory cell string are formed over a single depletion channel.

36. A method of programming a NAND architecture floating gate memory cell array comprising:
applying a precharge voltage to a substrate of the NAND architecture memory array, wherein the NAND architecture memory array contains a plurality of depletion mode floating gate memory cells serially coupled in a source to drain coupled arrangement in a plurality of strings, where the plurality of depletion mode floating gate memory cells have a native UV erased threshold voltage (UV-Vth) that is negative, and where a pre-existing channel of carriers is present in a depletion channel in each string of the plurality of strings;
applying a word line programming voltage to a selected floating gate memory cell of each string of a selected number of strings;
applying a pass voltage to one or more non-selected floating gate memory cells of each string of the selected number of strings; and
selectively applying a program voltage to a channel of each string of the selected number of strings.

37. The method of claim 36, wherein applying the precharge voltage to the substrate of the NAND architecture memory array, wherein the NAND architecture memory array contains the plurality of depletion mode floating gate memory cells serially coupled in the source to drain coupled arrangement in the plurality of strings further comprises applying the precharge voltage to a substrate tub.

38. The method of claim 36, wherein selectively applying the program voltage to the channel of each string of the selected number of strings further comprises selectively applying the program voltage or a program-inhibit voltage to the channel of each string of the selected number of strings.

39. The method of claim 38, wherein selectively applying the program voltage or the program-inhibit voltage to each string of the selected number of strings further comprises selectively applying the program voltage or the program-inhibit voltage to a drain of a first floating gate memory cell of each string of the selected number of strings.

40. The method of claim 39, wherein applying the program voltage or the program-inhibit voltage to the drain of the first floating gate memory cell of each string of the selected number of strings further comprises applying the program voltage or the program-inhibit voltage to the drain of the first floating gate memory cell of each string of the selected number of strings through a depletion mode drain select gate transistor.

41. The method of claim 36, wherein applying the precharge voltage to the substrate of the NAND architecture memory array, wherein the NAND architecture memory array contains the plurality of depletion mode floating gate memory cells serially coupled in the source to drain coupled arrangement in the plurality of strings and applying the word line programming voltage to the selected floating gate memory cell of each string of the a selected number of strings further comprises applying the precharge voltage on the substrate and applying the word line programming voltage to the selected floating gate memory cell of each string of the selected number of strings after uncoupling the precharge voltage.

42. The method of claim 36, wherein applying the precharge voltage to the substrate of the NAND architecture memory array, wherein the NAND architecture memory array contains the plurality of depletion mode floating gate memory cells serially coupled in the source to drain coupled arrangement in the plurality of strings and applying the word line programming voltage to the selected floating gate memory cell of each string of the selected number of strings further comprises applying the precharge voltage on the substrate and applying the word line programming voltage to the selected floating gate memory cell of each string of the selected number of strings before uncoupling the precharge voltage.

43. The method of claim 36, wherein applying the precharge voltage to the substrate of the NAND architecture memory array, wherein the NAND architecture memory array contains the plurality of depletion mode floating gate memory cells serially coupled in the source to drain coupled arrangement in the plurality of strings and applying the word line programming voltage to the selected floating gate memory cell of each string of the selected number of strings further comprises applying the precharge voltage on the substrate, applying the word line programming voltage to the selected floating gate memory cell of each string of the selected number of strings, and uncoupling the precharge voltage after the gate programming voltage has reached a selected voltage level.

44. A method of programming a NAND architecture floating gate memory cell array comprising:
applying a precharge voltage to a source line;
coupling the precharge voltage from the source line to a selected number of depletion mode NAND memory cell strings of a NAND architecture memory array, wherein each memory cell string of the array contains a plurality of depletion mode floating gate memory cells serially coupled in a source to drain coupled arrangement, where the plurality of depletion mode floating gate memory cells have a UV erased threshold voltage (UV-Vth) that is negative, and where a pre-existing channel of carriers is present in a depletion channel in one or more depletion mode floating gate memory cells in each string;

applying a word line programming voltage to a selected floating gate memory cell of each string of a selected number of strings;

applying a pass voltage to one or more non-selected floating gate memory cells of each string of the selected number of strings;

uncoupling the precharge voltage from the selected number of strings; and selectively applying a program voltage to a channel of each string of the selected number of strings.

45. The method of claim 44, wherein selectively applying the program voltage to the channel of each string of the selected number of strings further comprises selectively applying the program voltage or a program-inhibit voltage to the channel of each string of the selected number of strings.

46. The method of claim 44, further comprising storing multiple bits of data as differing threshold voltage levels in each depletion mode floating gate memory cells of the memory array, such that each floating gate memory cell is a multi-level cell (MLC).

47. The method of claim 45, wherein coupling the source line and applying the program voltage or the program-inhibit voltage to the channel of each string of the selected number of strings further comprises coupling the source line and applying the program voltage or the program-inhibit voltage to the channel of each string of the selected number of strings through a depletion mode drain select gate and a depletion mode source select gate.

48. A method of programming a NAND architecture floating gate memory cell array comprising:

selectively applying a program voltage to a plurality of bitlines;

coupling the program voltage from the plurality of bitlines to a channel of a selected number of depletion mode NAND memory cell strings of a NAND architecture memory array to precharge the channel, wherein each memory cell string of the array contains a plurality of depletion mode floating gate memory cells serially coupled in a source to drain coupled arrangement, each depletion mode floating gate memory cell having a UV erased threshold voltage (UV-Vth) that is negative, and where the channel of the selected number of depletion mode NAND memory cell strings is a pre-existing channel of carriers of a depletion channel in each selected string;

applying a programming word line voltage to a selected floating gate memory cell of each string of a selected number of strings; and applying a pass voltage to one or more non-selected floating gate memory cells of each string of the selected number of strings.

49. The method of claim 48, wherein selectively applying the program voltage to the plurality of bitlines and coupling the program voltage from the plurality of bitlines to the channel of the selected number of depletion mode NAND memory cell strings further comprises selectively applying the program voltage or a program-inhibit voltage to plurality of bitlines and coupling the program voltage or the program-inhibit voltage from the plurality of bitlines to the channel of the selected number of depletion mode NAND memory cell strings.

50. The method of claim 49, wherein selectively applying the program voltage or the program-inhibit voltage to plurality of bitlines and coupling the program voltage or the program-inhibit voltage from the plurality of bitlines to the channel of the selected number of depletion mode NAND memory cell strings further comprises selectively applying the program voltage or the program-inhibit voltage to a drain of a first floating gate memory cell of each string of the selected number of strings.

51. The method of claim 49, wherein selectively applying the program voltage or the program-inhibit voltage to plurality of bitlines and coupling the program voltage or the program-inhibit voltage from the plurality of bitlines to the channel of the selected number of depletion mode NAND memory cell strings further comprises applying the program voltage or the program-inhibit voltage to the plurality of bitlines and coupling the bitlines to the channel of each string of the selected number of strings through a depletion mode drain select gate.

52. A method of programming a NAND architecture floating gate memory cell array comprising:

selectively applying either a program voltage or a program inhibit voltage to a channel of a selected number of depletion mode NAND memory cell strings of a NAND architecture memory array, wherein each memory cell string of the array contains a plurality of depletion mode floating gate memory cells serially coupled in a source to drain coupled arrangement, and where the channel is a pre-existing depletion channel of carriers formed in each depletion mode NAND memory cell string, and where the plurality of depletion mode floating gate memory cells have a UV erased threshold voltage (UV-Vth) that is negative;

applying a word line programming voltage to a selected floating gate memory cell of each string of a selected number of strings; and applying a pass voltage to one or more non-selected floating gate memory cells of each string of the selected number of strings.

53. The method of claim 52, wherein selectively applying either the program voltage or the program-inhibit voltage to the channel of the selected number of depletion mode NAND memory cell strings further comprises applying the program voltage or the program-inhibit voltage to the channel of each string of the selected number of strings through a depletion mode drain select gate.

54. A method of programming a NAND architecture floating gate memory cell array comprising:

applying a precharge voltage to a substrate of the NAND architecture memory array, wherein the NAND architecture memory array contains a plurality of depletion mode floating gate memory cells serially coupled in a source to drain coupled arrangement in a plurality of strings, each depletion mode floating gate memory cell having a UV erased threshold voltage (UV-Vth) that is negative, and where a pre-existing channel of carriers of a depletion channel is present in each selected depletion mode NAND memory cell string before applying the precharge voltage;

applying a word line programming voltage to a selected floating gate memory cell of each string of a selected number of strings;

applying a pass voltage to one or more non-selected floating gate memory cells of each string of the selected number of strings; and selectively applying a negative polarity program voltage to a channel of each string of the selected number of strings.

55. A method of programming a NAND architecture floating gate memory cell array comprising:

applying a precharge voltage to a source line;

coupling the precharge voltage from the source line to a selected number of NAND memory cell strings of a NAND architecture memory array, wherein each memory cell string of the array contains a plurality of depletion mode floating gate memory cells serially coupled in a source to drain coupled arrangement, each depletion mode floating gate memory cell having a UV erased threshold voltage (UV-Vth) that is negative, and where a pre-existing channel of carriers of a depletion channel is present in each selected depletion mode NAND memory cell string before applying the precharge voltage;

applying a word line programming voltage to a selected floating gate memory cell of each string of a selected number of strings;

applying a pass voltage to one or more non-selected floating gate memory cells of each string of the selected number of strings;

uncoupling the precharge voltage from the selected number of strings; and selectively applying a negative polarity program voltage to a channel of each string of the selected number of strings.

56. A method of programming a NAND architecture floating gate memory cell array comprising:

selectively applying a negative polarity program voltage to a plurality of bitlines;

coupling the negative polarity program voltage from the plurality of bitlines to a channel of a selected number of NAND memory cell strings of a NAND architecture memory array to precharge the channel, wherein each memory cell string of the array contains a plurality of depletion mode floating gate memory cells serially coupled in a source to drain coupled arrangement, each depletion mode floating gate memory cell having a UV erased threshold voltage (UV-Vth) that is negative, and where a pre-existing channel of carriers of a depletion channel is present in each selected depletion mode NAND memory cell string before precharging the channel with the negative polarity program voltage from the plurality of bitlines;

applying a word line programming voltage to a selected floating gate memory cell of each string of a selected number of strings; and applying a pass voltage to one or more non-selected floating gate memory cells of each string of the selected number of strings.

57. A method of programming a NAND architecture floating gate memory cell array comprising:

selectively applying either a negative program voltage or program-inhibit voltage to a channel of a selected number of NAND memory cell strings of a NAND architecture memory array, wherein each memory cell string of the array contains a plurality of depletion mode floating gate memory cells serially coupled in a source to drain coupled arrangement, and where the channel is a pre-existing depletion channel of carriers formed in each depletion mode NAND memory cell string, and where the plurality of depletion mode floating gate memory cells have a UV erased threshold voltage (UV-Vth) that is negative;

applying a word line programming voltage to a selected floating gate memory cell of each string of a selected number of strings; and applying a pass voltage to one or more non-selected floating gate memory cells of each string of the selected number of strings.

* * * * *

UNITED STATES PATENT AND TRADEMARK OFFICE
CERTIFICATE OF CORRECTION

PATENT NO. : 7,457,156 B2  Page 1 of 1
APPLICATION NO. : 10/933196
DATED : November 25, 2008
INVENTOR(S) : Nazarian It is certified that error appears in the above-identified patent and that said Letters Patent is hereby corrected as shown below:

In column 28, line 30, in Claim 41, after "the" delete "a".

Signed and Sealed this

Twenty-fourth Day of February, 2009

JOHN DOLL
*Acting Director of the United States Patent and Trademark Office*